United States Patent [19]
Jerman et al.

[11] Patent Number: 6,049,650
[45] Date of Patent: Apr. 11, 2000

[54] STRUCTURE FOR MICRO-MACHINE OPTICAL TOOLING AND METHOD FOR MAKING AND USING

[75] Inventors: John H. Jerman, Palo Alto; John D. Grade, Mountain View, both of Calif.

[73] Assignee: Seagate Technology, Inc., Scotts Valley, Calif.

[21] Appl. No.: 09/107,221

[22] Filed: Jun. 30, 1998

Related U.S. Application Data

[60] Provisional application No. 60/082,071, Apr. 17, 1998.

[51] Int. Cl.$^7$ ................ G02B 6/00; H01L 21/70
[52] U.S. Cl. .............. 385/137; 385/14; 385/11; 385/52; 385/134; 385/136; 385/147; 437/51; 437/250
[58] Field of Search .................. 385/14, 11, 137, 385/134, 136, 147, 51, 52; 437/51, 54, 250, 131, 132

[56] References Cited

U.S. PATENT DOCUMENTS

| | | | |
|---|---|---|---|
| 4,270,838 | 6/1981 | Furusawa et al. | 350/81 |
| 4,945,400 | 7/1990 | Blonder et al. | 385/88 X |
| 4,998,796 | 3/1991 | Bonanni et al. | 385/65 X |
| 5,123,073 | 6/1992 | Pimpinella | 385/59 |
| 5,363,190 | 11/1994 | Inaba et al. | 356/337 |
| 5,377,289 | 12/1994 | Johnson et al. | 385/65 |
| 5,404,417 | 4/1995 | Johnson et al. | 385/137 |
| 5,528,724 | 6/1996 | Chang et al. | 385/137 |
| 5,550,942 | 8/1996 | Sheem | 385/53 |
| 5,579,424 | 11/1996 | Schneider | 385/49 |
| 5,600,741 | 2/1997 | Hauer et al. | 385/35 |
| 5,646,928 | 7/1997 | Wu et al. | 369/112 |
| 5,687,267 | 11/1997 | Uchida | 385/89 |
| 5,692,089 | 11/1997 | Sellers | 385/137 |
| 5,709,773 | 1/1998 | Field et al. | 156/647.1 |
| 5,812,720 | 9/1998 | Dannoux | 385/115 |
| 5,833,202 | 11/1998 | Wolfgang | 248/466 |
| 5,852,298 | 12/1998 | Hatakeyama et al. | 250/492.2 |
| 6,002,827 | 12/1999 | Ekwall | 385/135 |

OTHER PUBLICATIONS

Johnson, "Precise alignment of optical fibers using a micro-fabricated silicon device" (DuPont, Applied Engineering, Wilmington, DE, Int. Supp. Opt. Inst., Jul. 1993, 7 pages).

(List continued on next page.)

*Primary Examiner*—Brian Healy
*Attorney, Agent, or Firm*—Flehr Hohbach Test Albritton & Herbert

[57] ABSTRACT

Micro-machined tools and component holders useful for the manufacture, assembly, and testing of precision micro-miniature parts are provided, particurlarly embodiments well adapted for precision micro-miniature systems incorporating optical and/or electronic components including lenses, optical fibers, and the like. Structure and method find particular applicability in the precision optical systems of the read, write, or read/write heads of optically assisted storage devices for digital computers. Removable tools are used to temporarily position components while the components are glued or otherwise fixed into place during assembly, and then completely removed for use with another head assembly. Break-away tools or holders typically include three major portions: an element holder, a handle, and a break-away neck portion connecting the holder with the handle. The element holder provides a mounting block for an optical, electrical, or mechanical element. Once the elements are attached to the mounting blocks, they are moved into position within the larger assembly via the handle, the mounting block is glued to the assembly and a small predictable force is applied to the handle to break the neck and separate the handle from the holder which is at that time attached to the assembly. Tools may be formed by photolithographically patterened and etching a substrate such as silicon to selectively carve the substrate. Structures formed from plated metal, either on a base material, or made entirely of metal are also provided by the invention. Several embodiments of process for forming the inventive structures are also provided.

70 Claims, 17 Drawing Sheets

OTHER PUBLICATIONS

Keller et al., "Hexsil tweezers for teleoperated micro-assembly", (Univ. Calif. Berkeley, 1997, pp. 72–77).

Guyenot et al., "Mounting, cementing and handling of microoptical elements" (SPIE, vol. 2783, pp. 105–116).

Lin et al., "Micromachined integrated optics for free-space interconnections" (IEEE, 1985, pp. 77–82).

Mohr et al., "Microoptical devices based on free space optics with LIGA microoptical benches examples and perspectives" (SPIE vol. 2783, pp. 48–54).

Yasseen et al., "A rotary electrostatic micromotor 1×8 optical switch" (1998 IEEE pp. 117–120).

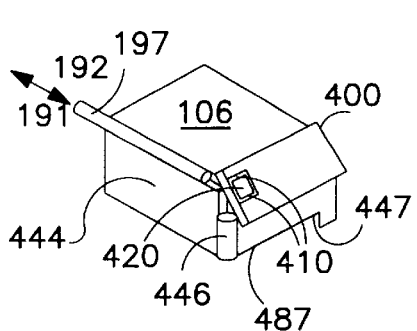
FIG.4A
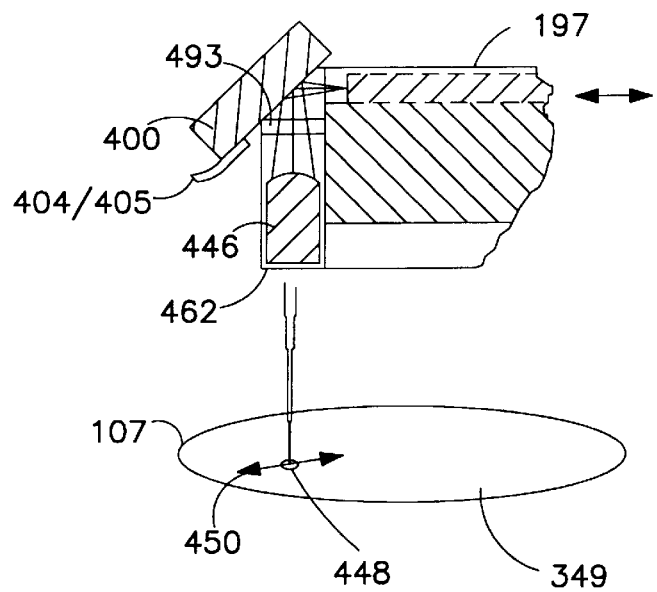
FIG.4B
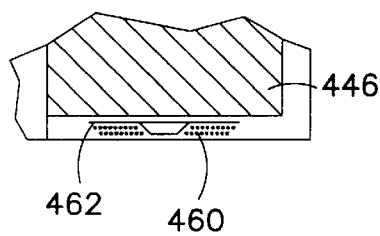
FIG.4C
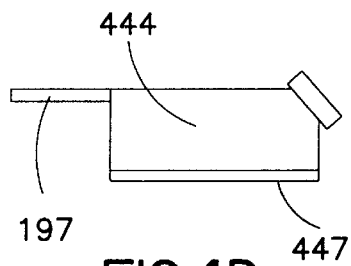
FIG.4D
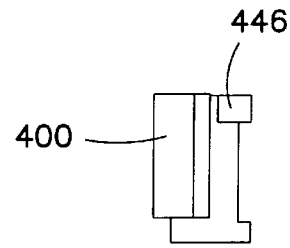
FIG.4E
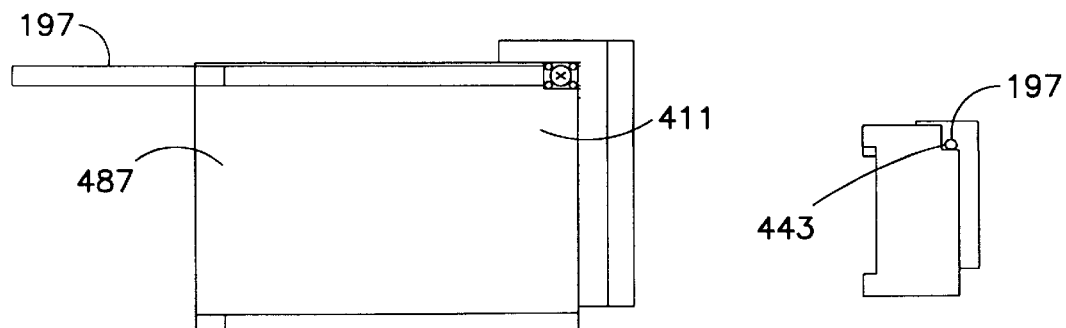
FIG.4F
FIG.4G

STRUCTURE FOR MICRO-MACHINE OPTICAL TOOLING AND METHOD FOR MAKING AND USING

CROSS-REFERENCE TO RELATED APPLICATIONS

The application claims priority to U.S. Provisional Patent Application Ser. No. 60/082,071 filed Apr. 17, 1998, pending, and hereby incorporated herewith.

INTRODUCTION

1. Field of the Invention

This invention relates generally to micro-machined structures and methods for positioning, holding, and manipulating small dimensioned structures, such as optical and electronic elements having dimensions of a few to several hundred microns, and more particularly to such apparatus and method for positioning in optically assisted data storage devices, and to method for fabricating such micro-machined structures.

2. Background

Conventional structures and methods for assembling very small mechanical, optical, or electronic components may conveniently be categorized into one or more of three groups or categorizes: precision assembly, optical fiber alignment, and micro-machined micro-optics. Of these methods, several involve the use of x-, y-coordinate micro-manipulators which provide micron and sub-micron positioning but do not provide means for holding the tiny parts during assembly. Other conventional techniques involved the use of tweezers to hold a part during manipulation and assembly. Often such techniques required repeated attempts to manipulate the part into position relative to another part until successful. For example, a multitude of attempts to place a micro-gear onto a micro-shaft in a machine might consume several hours of trial and error until the gear was successfully placed onto the shaft. These kinds of time and labor consuming techniques were tolerated because of the typically limited number of devices that were fabricated, sometimes only one or a few devices in connection with research & development activities.

Other attempts to efficiently produce micro-machines involved fabrication in place, however, such techniques did not allow the use of disparate materials with the result that the individual elements had sub-optimal characteristics. This was particularly problematic for optical systems, since the material requirements for optical lenses would normally be quite different from holders, gears, apertures, and so forth.

Conventional Electrical Discharge Machining (EDM) technology, particularly conventional wire EDM in some instances provides some additional capabilities over the earlier techniques, but is still problematic. In conventional wire EDM, a thin wire, typically between about 75 microns and about 150 microns in diameter, is used to stencil or cut each part from a larger substrate. In this process, an electric current generates an arc across a gap that cuts the substrate interposed through the gap and the wire moves relative to the substrate to trace out the desired shape. This wire EDM procedure nominally permits a minimum feature to substrate size ratio of about 1:20, that is a 10 micron feature may be fabricated in or from a 200 micron thick substrate, but slots that are cut in the substrate must be at least about the diameter of the cutting wire.

Other techniques for forming micro-mechanical structures involve plating a metal over a substrate and then separating the metal from the substrate either before or after cutting individual plated elements apart. The plating alone provides the final finished part.

Precision assembly methods have involved the use of press-fitting pins into holes and the use of spheres in grooves and holes to constrain two pieces of an instrument or a precision stage. The use of "snap-together" plastic pieces and various snap fasteners to align and fasten conventional assemblies for structures having minimum feature sizes of about 500 µm is also known. However, the use of injection plastic for structures having features sizes below about 100 µm is very difficult, because the plastic material cannot easily be forced into the very small cavities and voids and subsequently released, and furthermore, plastic materials formed in this manner would typically not provide the required physical characteristics.

Several references have been published describing the fabrication and assembly of small parts or articles of manufacture. For example, in "Mounting, Cementing and Handling of Microoptical Elements", by V. Guyenot, et. al., SPIE v. 2783, 1996, pp. 105–116, there are described various grippers and vacuum pickup tools in micro-miniature precision assembly for placement of miniature lenses and the like into optical assemblies. In this procedure, small grippers are provided to directly pick up, transport, and place the components onto dispensed adhesive droplets, but the reference makes the assumption that convenient locations and features are available on the elements to allow pickup with these grabbers, and further that clearance in the intended location allows placement of the parts to their desired destination in the assembly. Not all micro-miniature assembly operations meet these requirements, so that the structures and techniques may not typically be applicable. More particularly, these conditions may not be met for the situations encountered in micro-miniature optical head assemblies.

Various micro-machined structures have been used for alignment of optical fibers, particularly in splicing fibers and in aligning laser diodes and collimating lenses to optical fibers. Among these structures are those relying on a simple V-groove etched into a substrate. While these v-groove structures may have been adequate for their intended purpose, they may not typically permit any adjustment in position or movement of the fiber with respect to the v-groove, and did not typically allow for the predictable variations in fiber diameter or fiber core centricity.

Another type of optical fiber coupling device relies on the use of a somewhat complex multi-wafer, anisotropically-etched, bulk micro-machined structure that forms opposing, split v-grooves with restoring springs. Two fibers, end-coupled in the device tend to be at least somewhat centered in the v-grooves, which in principle aligns the cores of the fibers; however, the actual alignment achieved may be less than desired. Furthermore, at least in part because of its complexity, the structure would be relatively expensive to fabricate, and variations or entirely different structures may generally be required for each specific alignment or assembly task. Optical fiber coupling devices of this type have been described, for example in a reference titled "Precise Alignment of Optical Fibers using a Micro fabricated Silicon Device", Melvin Johnson, Int. Symp. Opt. Inst. and Appl. Sci., July, 1993, San Diego, and in U.S. Pat. Nos. 5,377,289 and 5,404,417; each of which are hereby incorporated by reference.

Other publications have been directed toward the possible integration of optical components on "micro-optical benches". These devices either form various slots and grooves for conventional elements or form all of the elements in a single system on one substrate and then bend or fold the elements into alignment. For example, these types of a devices are described in "Microoptical devices based on free space optics with LIGA microoptical benches, examples and perspectives," J. Mohr, J. Gottert, and A. Muller, SPIE V. 2783, 1996, pp. 48–54, and "Micro machined Integrated Optics for Free-Space Interconnections", L. Y. Lin, et. al., MEMS'95, pp. 77–82. Neither of these structures or techniques addresses the need for precision assembly of microoptical elements into structures that cannot easily be formed with precise mating features or with integrated optical elements, or need to be adjusted to meet a specific function, such as precise focus or collimation. Furthermore, integration in place rules out the possibility of using disparate materials, so that a compromise material may be required. The sacrifice, especially the sacrificed optical performance, may not be tolerable for some applications.

Micro-tweezers have also been conventionally used for delicate assembly of miniature structures. Most such micro-tweezers lack enough force or jaw displacement to adequately hold parts, and/or require considerable clearance in the assembly to place the part. More recently, some test structures having "tethers" to connect the test structures to the substrate after sacrificial etching, as well as some beam elements that seem to mate during assembly, have been describe in the literature. For example, so called "hexcil tweezers" have been described in "Hexcil tweezers for teleoperated microassembly", C. G. Keller and R. T. Howe, MEMS'97, pp. 72–77. However, even these tweezers have limited applicability and may not be suitable for many assembly operations. For example, in assembling optical heads involving UV-curing or high viscosity adhesives, the hexcil tethers and beam structures may not be applicable because their gripping force is limited and they cannot hold parts adequately during adhesive cure.

Therefore there still remains a need for an improved method of positioning miniature components to allow sub-micron adjustment of relative position with respect to other components. There also remains a need for structures and methods that require little or no space around the elements, as there is often little or no clearance between the element to be assembled and the groove or other receiver structure into which the part is assembled. There also remains a need for structure and methods which provide inexpensive but extremely precise assembly fixtures, and for structures that provide sufficient flexibility in the design of the parts to serve multiple functions.

SUMMARY OF THE INVENTION

The invention is directed to micro-machined tools and component holders useful for the manufacture, assembly, and testing of precision microminiature parts. The invention is particularly well adapted for manufacture, assembly, and testing of precision micro-miniature systems incorporating optical and/or electronic components including lenses, optical fibers, and the like. The inventive structure and method finds particular applicability in the precision optical systems of the read, write, or read/write heads of optically assisted storage devices for digital computers. Such optically assisted storage devices include but are not limited to Winchester drive type drive heads, CD-ROM storage device, DVD type readers and recorders and, magneto-optical devices, to name a few exemplary devices.

The high storage density of these type of devices combined with the frequent provision of stacked multiple optical discs or platters and the requirement for the lowest possible read/write head mass and moment of inertia, mean that the head components (e.g. lens or lenses, coils, fiber optics, mirrors, beam-splitters, apertures, and the like must be as small and low-mass as possible. At the same time, the absolute and relative positions must be accurate and precise. For head components having individual dimensions on the order of a few 10's to 100's of microns (for example, lens diameters from about 100 microns to about 400 microns, and electric coil diameters from about 100 microns to about 300 microns) the head components must typically be positioned within about 0.5 $\mu$m of the design location.

The inventive structures, particularly the removable tools and the holders having break-away handles, facilitate head and head component size and mass reduction while allowing diverse and optimal materials to be employed in the head. The inventive tooling provides for the precise alignment of small components in the Optically Assisted Winchester (OAW) head. Removable tools are used to temporarily position components while the components are glued or otherwise fixed into place during assembly, and then completely removed for use with another head assembly. Removable tools might include for example, optical fiber holders, alignment targets, lens holders, retro-reflecting mirrors and spacers. Break-away tools or holders typically include three major portions: an element holder, a handle, and a break-away neck portion connecting the holder with the handle. The element holder provides a mounting block for an optical, electrical, or mechanical element. For example, the holder may mount a lens, a fiber, a fiber key, a coil, or the like element. The optical element is mounted to the holder using any convenient method. While the elements and holder are small, access to the element receiver (for example a stepped hole in the mounting block to receive and seat a circular lens) is relatively unhindered. Once the optical elements are attached to the mounting blocks, they are moved into position within the larger head assembly via the handle. After alignment, the mounting block is glued to the head assembly and a small predictable force is applied to the handle to break the neck and separate the handle from the holder which is at that time attached to the assembly. As a result, the optical component is easily positioned in the head assembly using the relatively large handle with only the small mounting block remaining in the head after assembly.

In one embodiment of the invention, a substrate, such as for example a mono-crystalline silicon or other semiconductor wafer, is etched using Deep Reactive Ion Etching (DRIE) to selectively carve first and second sides of the substrate. Photo-resist material is separately applied to each side of the wafer to selectively expose or protect particular regions of the wafer. The unprotected regions of the wafer are etched to the desired depth so that recesses, shelves, through holes or apertures, and other structural features may be formed. Multiple applications of photo-resist material with etching may be applied to the same surface so that regions having different depth profiles may be formed on the same surface. The use of silicon is advantageous for the break-away holders because it has a predictable fracture characteristic which facilitates fracture of the neck at a predetermined region and with a predetermined force which is less than a force that might disturb the integrity or alignment of the optical assembly.

In another embodiment, the invention provides a tool for manipulating a first article relative to a second article, and includes a manipulator portion for interacting with the first article to be manipulated; and an elongated handle portion integrally formed with and extending from the manipulator portion and adapted to be held by an external positioning means. The tool is adapted for accessing and interacting with the first article to be manipulated in a confined space proximate the second article. Preferably, the tool is formed from a single piece of crystalline material; and the manipulator portion adapted to interact with a physical feature of the first article having a size dimension less than 500 microns.

Structures formed from plated metal, either on a base material, or made entirely of metal are also provided by the invention. Several embodiments of process for forming the inventive structures are also provided.

The inventive structure and method incorporate numerous design details and innovative elements, some of which are summarized below. Other inventive structures, methods, and elements are described in the detailed description.

BRIEF DESCRIPTION OF THE DRAWINGS

Additional objects and features of the invention will be more readily apparent from the following detailed description and appended claims when taken in conjunction with the drawings, in which:

FIGS. 4a–4g show the flying magneto-optical head of the magneto-optical data storage and retrieval system of FIG. 1 in a perspective, a side cross-sectional, an expanded cross-sectional, a side, a front, a bottom and a rear view, respectively.

FIG. 8 is a diagrammatic illustration showing a micro-machined holder having a break-away handle (FIG. 8a), and wafer surface masking patterns (FIGS. 8b and 8c) prior to etching to realize the structure shown in FIG. 8a.

DESCRIPTION OF SPECIFIC EMBODIMENTS

The inventive structure and method are now described in the context of specific exemplary embodiments.

Figure 1:
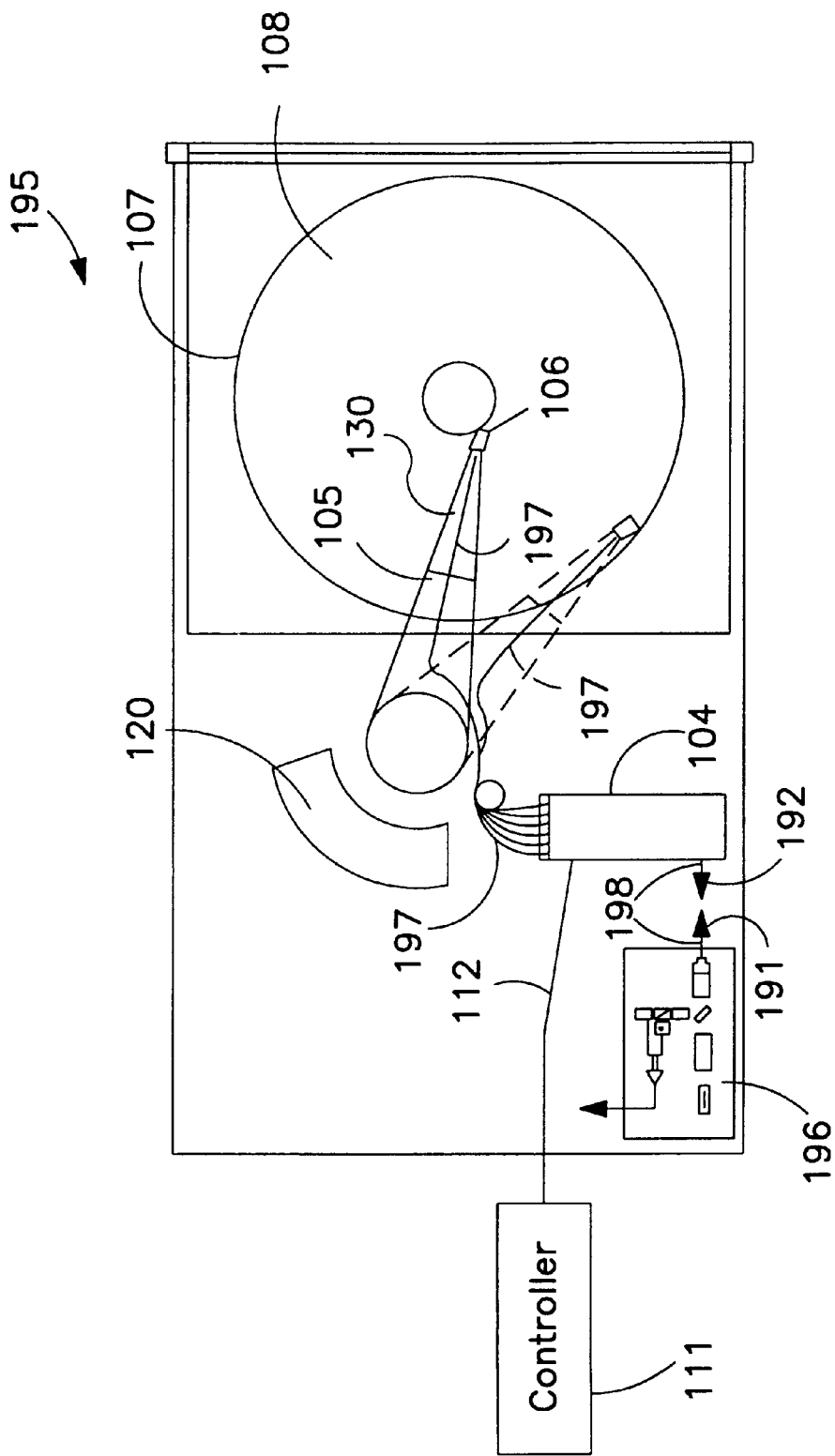
FIG. 1 is a schematic view of a magneto-optical data storage and retrieval system incorporating the optical switch of the present invention.

Referring now to the drawings, FIG. 1 is a plan view illustrating some of the basic elements of a magneto-optical (MO) data storage and retrieval system. Few specific details are identified in this and FIGS. 2 through 4 as they are intended to portray some of the basic elements of a functional system in which the present invention is useful. The invention is not limited to use in only one specific MO data storage system.

Referring to FIG. 1, the system 195 includes a set of flying heads 106 whose details will be described below that are adapted for use with a plurality of "N" MO discs 107. In one embodiment, N equals six and thus a plurality of six discs 107 are provided in a stack (not shown). Each of the discs 107 is double sided and provided with first and second opposite planar surfaces 108. One flying head 106 is provided for each MO disc surface 108. The heads 106 are coupled to a rotary actuator magnet and coil assembly 120 by a suspension 130 and actuator arm 105 to be positioned over the surfaces of the MO discs 107. In operation, the MO discs 107 are rotated by a spindle motor (not shown) to generate aerodynamic lift forces between the flying heads 106 and the rotating disc. This maintains each flying MO head 106 in a flying condition above the data recording surface of each MO disc. The lift forces are opposed by equal and opposite spring forces supplied by the suspensions 130. During non-operation, each flying MO head is maintained statically in a storage condition away from the surface of the MO disc 107, typically on a ramp (not shown) adjacent to the disc surface. It is of course possible that the heads could be landed on the surface of the disc in a non-data storage region; however, such an approach would not be the optimum approach.

System 195 further includes a laser-optics assembly 196, an optical switch or micro switch 104 coupled to assembly 196 by at least one input light carrying element or optical fiber 198, and a plurality of sets of single mode polarization maintaining (PM) optical fibers 197. In the exemplary embodiment, each set of single mode PM optical fibers or output light carrying elements 197 are coupled through a respective one of the set of actuator arms 105 and suspensions 130 to a respective one of the set of flying MO heads 106. Accordingly, at least six sets of two PM optical fibers 197 each are optically coupled at one end to optical switch 104. Each such set of PM optical fibers 197 is coupled at the other end to a set of two flying MO heads 106. It should be appreciated than only an exemplary number of PM optical fibers are shown in the drawings. A controller 111 is electrically coupled to optical switch 104 by means of wires 112 for providing electrical command signals to the optical switch. The controller 111 can be any conventional type.

Figure 2:
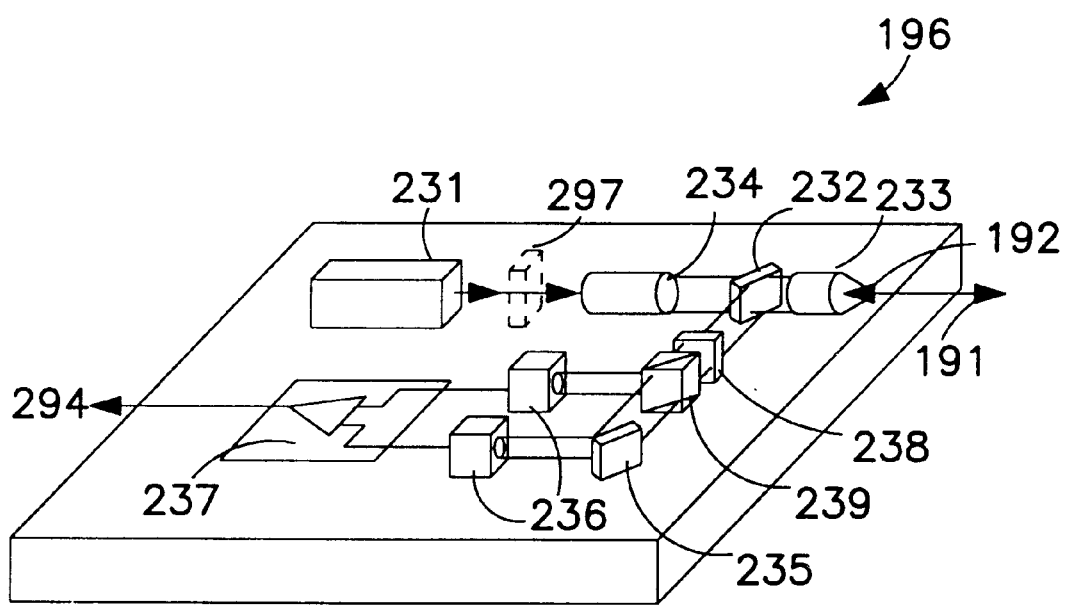
FIG. 2 is a schematic view of a laser-optics assembly of the magneto-optical data storage and retrieval system of FIG. 1.

FIG. 2 is a diagram showing the laser-optics assembly 196 of the magneto-optical data storage and retrieval system of FIG. 1. As will now be explained with respect to FIGS. 2 and 3, reading and storing information on the surface of each disc 107 requires both conveying the output of a laser through a fiber-optic to the flying head so that the light output is accurately imaged on the surface of the disc and generating a magnetic field utilizing a coil which is supported on the flying head 106 near to the surface of the disc. The description of FIGS. 2 and 3 will briefly summarize the reasons for providing both a light source and a magnetic field to selectively access the data on the surface of the disc. In FIG. 2, the laser-optics assembly 196 is shown to include a linearly polarized diode laser source 231 operating in a visible or near ultraviolet frequency region and emitting an optical power sufficient for reading and writing using the set of MO discs 107. In a first embodiment, the laser diode source may be a RF modulated laser source. In a second embodiment, the linearly polarized laser source 231 may be a distributed feed-back (DFB) laser source. In an exemplary embodiment, the linearly polarized laser source 231 is selected to operate within a range of 635–685 nm; however, a laser source of other wavelengths could also be used. The laser-optics assembly 196 further includes: a collimating optics 234, a low wavelength dispersion leaky beam splitter 232, and a coupling lens 233. The laser-optics assembly 196 directs (from the linearly polarized laser source 231) a linearly polarized outgoing laser beam 191 (shown in FIG. 1) to the optical switch 104. The laser-optics assembly 196 further includes: quarter-wave plate 238, a mirror 235, and a polarizing beam splitter 239. In the first embodiment, a linearly polarized laser beam 192 (shown in FIG. 1) reflected by a surface 108 of an MO disc 107 is directed by the optical switch 104 to the coupling lens 233, and is routed by the leaky beam splitter 232 to a differential detector comprising: the quarter-wave plate 238, the mirror 235, and the polarizing beam splitter 239. In the second embodiment, an optical isolator 297 is included between the laser source 231 and the collimating lens 234. As is well established in the art, this type of differential detection scheme measures the optical power in two orthogonal polarization components of the reflected laser beam 192, with a differential signal being a sensitive measure of polarization rotation induced by the Kerr effect at the surface of one of the set of MO discs 107. In both embodiments, after conversion by a set of photodiodes 236, the differential signal is processed by the differential amplifier 237 for output as signal 294. The present invention is not meant to be limited to the aforementioned arrangement of optical elements and sources of light, as other techniques for directing the outgoing laser beam 191 and for detecting the reflected laser beam 192 are well known in the art.

Figure 3:
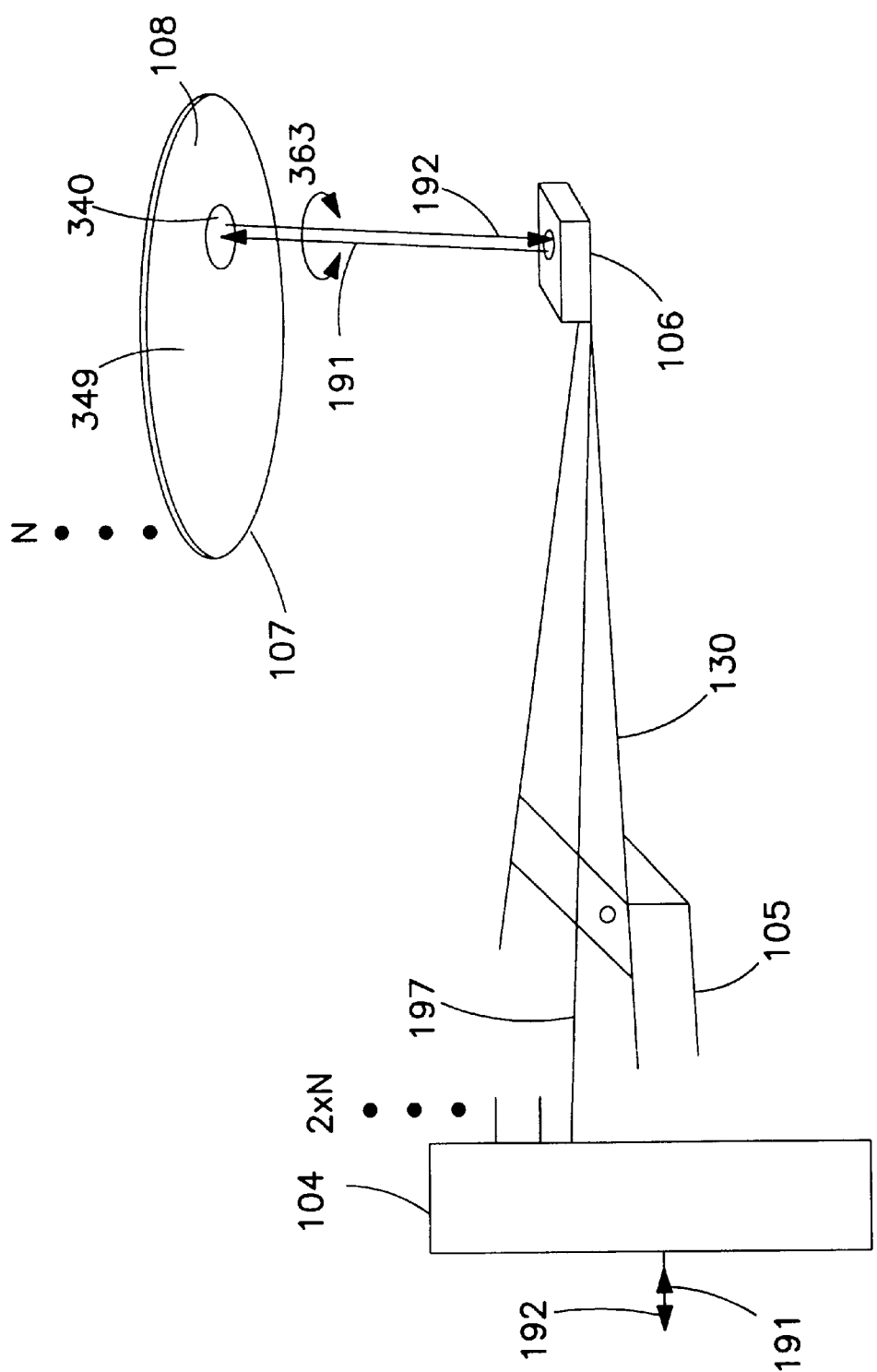
FIG. 3 is a schematic view showing a representative optical path that includes the use of a DFB laser source for use with the magneto-optical data storage and retrieval system of FIG. 1.

FIG. 3 is a diagram showing a representative optical path that includes the use of a DFB laser source. In one embodiment, a representative optical path is shown in FIG. 3 to include: an optical switch 104, one of the set of single-mode PM optical fibers 197, and one of the set of flying MO heads 106. The optical switch 104, as more filly discussed below, provides sufficient degrees of selectivity for directing the outgoing laser beam 191 (with reference to laser source 231) to enter a respective proximal end of a respective single-mode PM optical fiber 197. The outgoing laser beam 191 is further directed by the single-mode PM optical fiber 197 to exit a respective distal end so as to pass through the flying MO head 106 onto a recording/storage layer 349 underlying each surface 108 of a respective MO disc 107.

In one embodiment the outgoing laser beam 191 is provided by a linearly polarized laser source 231 that is a distributed feed-back (DFB)laser source. A DFB diode laser source, unlike an RF-modulated Fabry-Perot diode laser, produces a very narrowband single-frequency output due to the use of a wavelength selective grating element inside the laser cavity. When linearly polarized light from a laser source 231 that is a DFB laser source is launched into a single-mode PM optical fiber 197, the light exiting the optical fiber includes a polarization state that depends on the relative orientation between the fiber axes and the incident polarization.

During writing of information, the outgoing laser beam 191 is selectively routed by the optical switch 104 to the MO disc 107 so as to lower a coercivity of the recording/storage layer 349 by heating a selected spot of interest 340 to approximately the Curie point of the recording/storage layer 349. Preferably, the optical intensity of outgoing laser beam 191 is held constant, while a time varying vertical bias magnetic field is used to define a pattern of "up" or "down" magnetic domains perpendicular to the MO disc 107. This technique is known as magnetic field modulation (MFM). Alternatively, outgoing laser beam 191 may be modulated in synchronization with the time varying vertical bias magnetic field at the spot of interest 340 in order to better control domain wall locations and reduce domain edge jitter. Subsequently, as the selected spot of interest 340 cools, information is encoded within the recording/storage layer 349 of the respective spinning disc 107.

During readout of information, the outgoing laser beam 191 (at a lower intensity compared to writing) is selectively routed to the MO disc 107 such that at any given spot of interest 340, the Kerr effect causes (upon reflection of the outgoing laser beam 191 from the recording/storage layer 349) a reflected laser beam 192 to have a rotated polarization of either clockwise or counter clockwise sense 363 that depends on the magnetic domain polarity at the spot of interest 340.

The aforementioned optical path is bi-directional in nature. Accordingly, the reflected laser beam 192 is received through the flying MO head 106 and enters the distal end of the single-mode PM optical fiber 197. The reflected laser beam 192 propagates along the single-mode PM optical fiber 197 to exit at its proximal end and is selectively routed by the optical switch 104 for transmission to laser-optics assembly 196 for subsequent conversion to the signal 294.

FIGS. 4a–4g are diagrams showing the flying magneto-optical head of the magneto-optical data storage in a perspective, a side cross-sectional, an expanded cross-section, a side, a front, a bottom, and a rear view, respectively. In FIG. 4a, the flying MO head 106 is shown for use above a recording/storage layer 349 of one of the set of MO discs 107. The flying MO head 106 includes: a slider body 444, an air bearing surface 447, a quarter-wave plate 493, a reflective substrate 400, objective optics 446, a magnetic coil 460, and a yoke 462. The slider body 444 is dimensioned to accommodate the working distances between the objective optics 446, the single-mode PM optical fiber 97, and the reflective substrate 400. The reflective substrate 400 may include a reflective surface which is aligned so as to direct the outgoing laser beam 191 and 192 to and from the recording/storage layer 349. Although slider body 444 may include industry standard "mini", "micro", "nano", or "pico" sliders, alternatively dimensioned slider bodies 444 may also be used (as determined by the aforementioned dimensional constraints of the elements used with the flying MO head 106). Accordingly, in this embodiment, the slider body 444 comprises a mini slider height (889 μm) and a planar footprint area corresponding to that of a nano slider (1600× 2032 μm).

The single-mode PM optical fiber 197 is coupled to the slider body 444 along an axial cutout 443, and the objective optics 446 is coupled to the slider body 444 along a vertical corner cutout 411. Preferably, the cutouts 443 and 411 may be designed as channels, v-grooves, or any other suitable means for coupling and aligning the single-mode optical fiber 97 and objective optics 446 to the flying MO head 106. In this embodiment, the laser beams 191 and 192 traverse an optical path (to and from the recording/storage layer 349 of the MO disk 107) that includes: the single-mode PM optical fiber 197, the reflective substrate 400, the quarter-wave plate 493, and the objective optics 446. In this embodiment, the single-mode PM optical fiber 197 and the objective optics 446 are positioned within their respective cutouts to achieve focus of the outgoing laser beam 191 within the spot of interest 340 (see FIG. 3) as a focused optical spot 448. The single-mode PM optical fiber 197 and the objective optics 446 may be subsequently secured in place by using ultraviolet curing epoxy or similar adhesive.

With respect to the present invention, attention is especially directed to FIGS. 4c and 4b. These two figures show the objective optics 446 which are used to focus the optical spot in a defined size 448 on the surface 349 of the disc. The spot is focused through a yoke 462 and low profile magnetic coil 460 which are incorporated in support structure 461 and mounted on the bottom of the flying MO head or on or near the surface of the objective optics 446, without interfering with the aerodynamic flying qualities of the flying MO head 106. It is the fabrication of the structure 461 incorporating the planar coils 460 surrounding the opening 463 through which the light is to be conveyed to the disc surface that is the particular subject of this invention. It will be further seen below that the present invention also solves the problem of bringing in the lead wires which supply current to the coil structure 460 while establishing reliable electrical connections to these coils but without adding to the complexity of the design.

We now turn our attention to a particular example of an optical assisted winchester head, such as may be used for a flying MO head 106 in the system 195, and with which the inventive structures may be advantageously employed. With respect to FIG. 5, there is shown a partial exploded assembly drawing of an Optical Assisted Winchester (OAW) head 50 during assembly. The OAW body 51 may typically be formed by conventional mechanical grinding of a carbide material and includes slots, recesses, protrusions and the like structures for receiving other OAW head structures, such as the optical fiber 52; having cladding portion 53 and jacket portion 54; a magnetic coil assembly 56; an optical waveplate 57; a mirror assembly 58; and break-away holder 59 for mounting a miniature lens.

Figure 5:
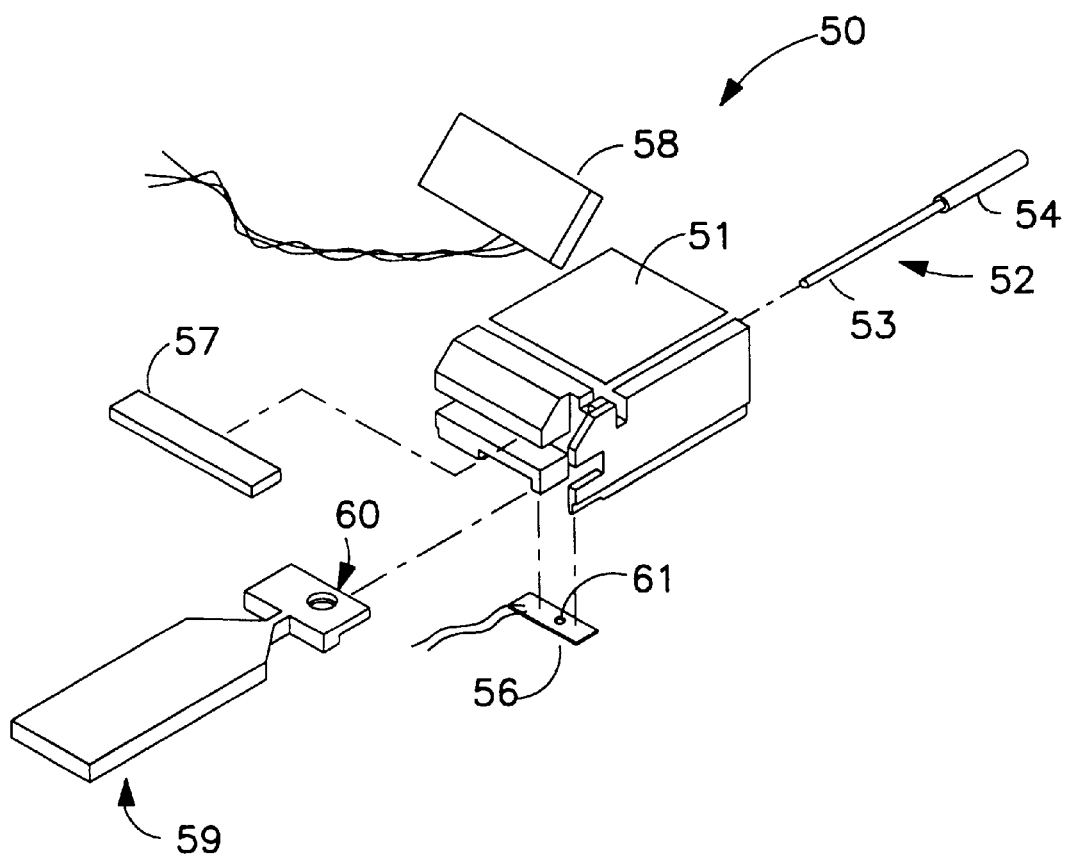
FIG. 5 is a diagrammatic illustration showing an embodiment of an exemplary micro-machined structure for holding an optical lens including a break-away handle portion and a lens holder portion.

While the OAW head 50 in FIG. 5 is merely illustrative of one application of the inventive structure and method, it will be appreciated that there is a requirement that lens 60 be located internal to the head 50 so that light communicated to the head via fiber 52, and reflected by mirror assembly 58, may be directed through the lens 60 and also through coil aperture 61. In the exemplary OAW head, the fiber has a nominal diameter of about 80 microns, the lens 60 a diameter of about 250 microns, and the coil aperture 61 a diameter of about 20 microns; therefore, the positioning of lens 60 within the head body 51 must be precise. As no direct access to the final lens or mounting block location is available, some means for remotely positioning the lens is needed. The break-away handle feature provides this remote positioning. The inventive tooling also opens opportunities for implementing structures that could not efficiently be assembled using conventional methods.

The environment and benefits of the invention having now been described, we now direct the description to an overview of an embodiment of the inventive fabrication method, and follow that by a description of particular embodiments of the inventive structures.

In a first embodiment of the inventive manufacturing method, the structures are made from mono-crystalline (single crystal) silicon using photo-lithographic techniques and Deep Reactive Ion Etching (DRIE). A silicon wafer such as is commonly used in the manufacture of silicon based electronic integrated circuits is conventionally prepared including slicing from the boule, grinding, lapping, and polishing to provide a wafer that may have a 100 mm diameter and a 200 micron thickness. Of course, those workers having ordinary skill in the art will appreciate that the inventive structures are not limited to structures manufactured using this particular technique, that the wafers may be larger (for example 200 mm or 300 mm diameter) and have greater or lesser than 200 micron thickness, and may be made from materials other than silicon.

Once the polished silicon wafer 70 has been prepared, a patterned photo resist material of conventional composition is applied to a first wafer side 71 in such manner that regions that are to be protected from etching are covered by the photo resist material 73 and regions that are to have material removed by etching are kept free from photo resist material (Step 201).

Figure 7:
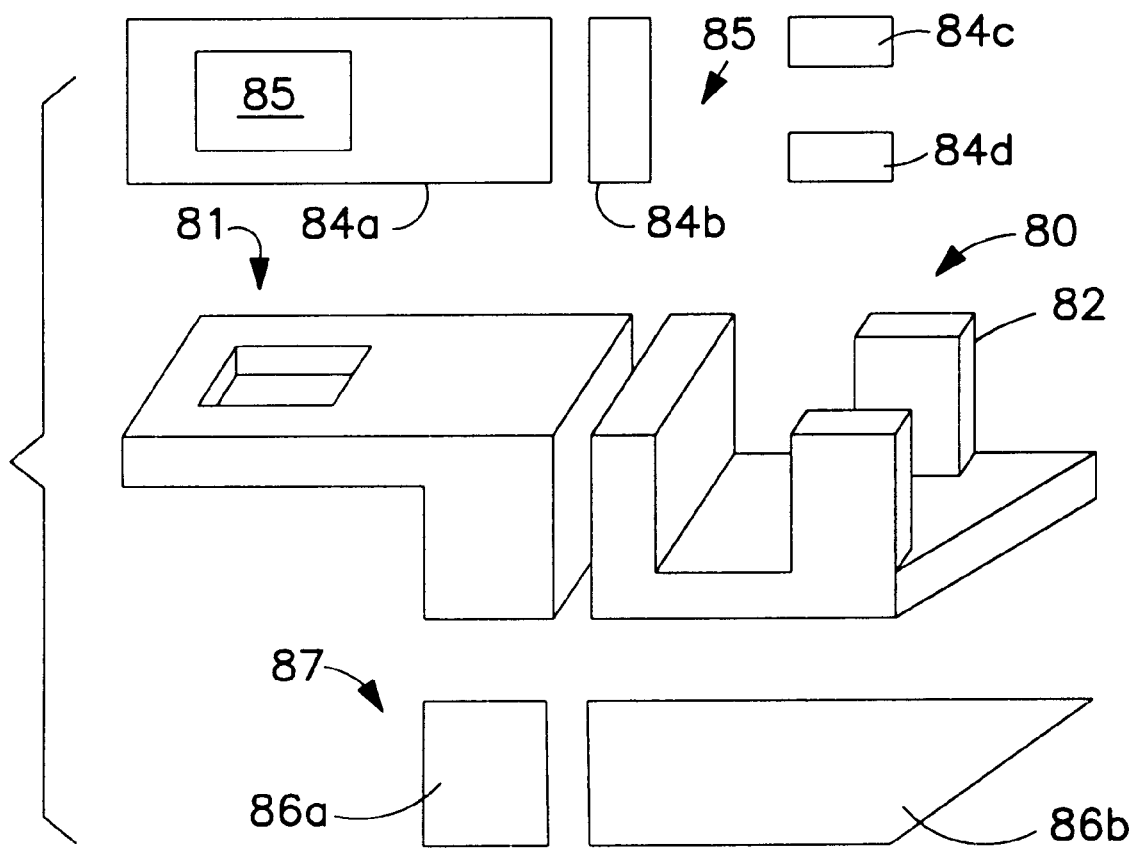
FIG. 7 is a diagrammatic illustration showing patterned photo resist application and selective etching from two sides of a wafer to fabricate micro-machined structures.
Figure 8A:
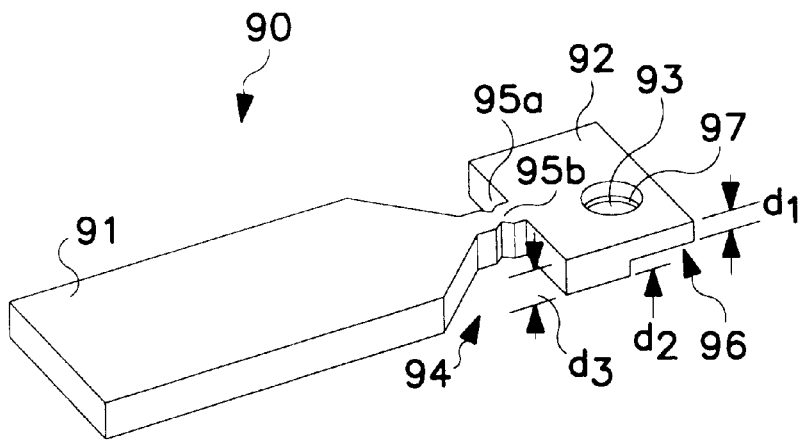
Figure 8B:
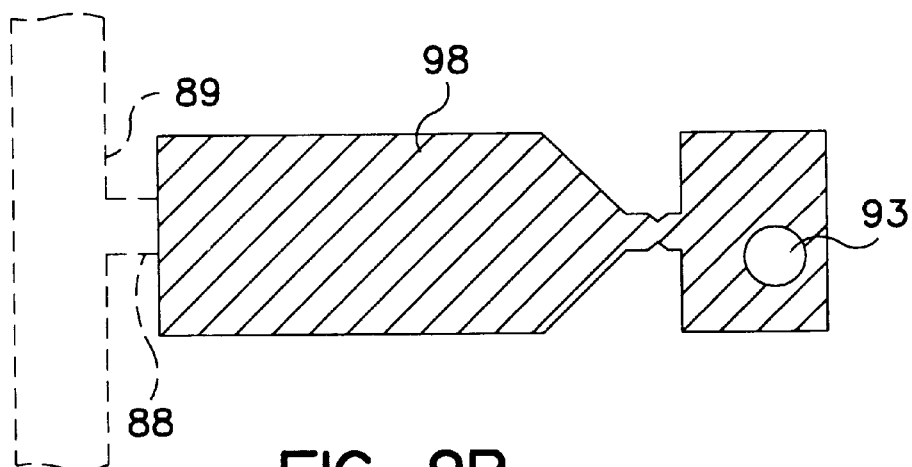
Figure 8C:
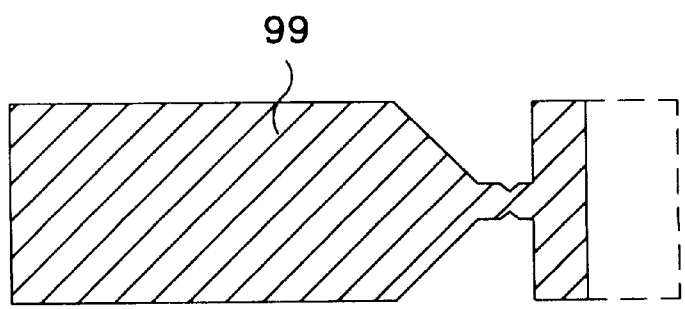

The manner in which patterned photo resistive material is applied to make an ion etched micro-structure is now further described relative to FIG. 6 which shows a structure made according to the inventive method, and FIG. 8 which shows the top-projected and bottom-projected photo resist regions for a break-away optical lens holder. With respect to the generalized etched structure in FIG. 7, the finished structure 80 illustrated in FIG. 7a has two sub-parts (81, 82) as a result of the through etching from the top and bottom wafer surfaces (81, 82). The top or first surface of the wafer has been coated with a material 83 resistive to the ion etching in regions 84a, 84b, 84c, and 84d and left free of resist material 83 in region 85 and the regions surrounding the part. It may be noted that a multitude of such parts are formed simultaneously from a single wafer and that the unprotected region 85 may generally be formed as islands within a photo resist surround and as a continuous region extending between and among the multitude of structures on the wafer. Similarly, the bottom or second surface of the wafer receives a different patterned photo resist material having protected regions 86a and 86b, and unprotected region 87. Those workers having ordinary skill in the art will appreciate that while the finished parts are shown having perfectly vertically etched walls extending between the first and second surfaces, some undermining of material may be expected so that the final structures do not necessarily have material remaining over the entire region to which photo resist material has been applied. These production parameters are taken into account during feature sizing as is common in the art so that the final structures have the desired dimensions. In similar manner, the depth of the recesses is controlled by the ion intensity and etch time to create the desired depth.

In an alternative procedure, where one surface of the tool is to remain flat without recesses, steps, shelves, protuberances, or the like features, then one may merely pattern a single side of the wafer and etch to create the desired characteristics and to mechanically saw the wafer to separate the tool from the wafer. In spite of the design constraints of the single side etch approach it is still a viable technique for some structures. Alternatively, multiple patterning and etching may be carried out on a single side to achieve the desired tool characteristics. Photolithography, the composition and application photo resistive material to semiconductors, and various types of etching including Deep Reactive Ion Etching (DRIE) are described in standard references (such as for example, *Handbook of Microlithography, Micromachining and Microfabrication*, Volume I and II, by P. Rai-Choundary, editor, published by SPIE Press in 1997, and hereby incorporated by reference) and are well known in the semiconductor processing arts, and not discussed further here.

In FIG. 8a, there is shown a perspective view of a break-away lens holder 90 structure according to the present invention. The lens holder 90 includes a handle portion 91 that has substantially uniform thickness throughout and a thickness between upper 91 and lower 92 surfaces that derives from the thickness of the unetched silicon wafer substrate. The upper surface 91 is substantially planar so that the entire upper surface except for a region where hole 93 is formed is protected by photo resist material 98 as illustrated by the diagonal hatched lines in FIG. 8b.

The region outside the lens holder 90 is left unprotected and the resulting etching (from upper and lower sides) effectively cuts the lens holder from the larger wafer. The patterned photo resist 98 also provides unprotected regions for the v-shaped notches 95a, 95b in the neck region 94 between the handle 91 and the holder mounting block 92. Optionally, but conveniently, a stem 88 may be provided to connect the handle portion 91 to a support 89 to facilitate orientation and handling of the plurality of lens holder 90 formed from a single wafer after etching and release from the heat release tape. In FIG. 8b, the lower wafer surface is illustrated showing a similar region 99 where patterned photo resist material has been deposited onto the wafer, except that a portion of the holder mounting block is left exposed so that a thinner section or shelf 96 is formed proximate the hole 93, and in fact the lower surface is etched down to extend to the hole formed in the upper surface.

In this particular structure, the shelf 96 has a thickness $d_1$ as the result of the removal of a thickness $d_2$ of material from the lower surface out of a total thickness of $d_3$. In this particular example, the wafer is etched to a depth of about $d_1$ in order to partially "cut out" holder 90, then the wafer is etched to remove about $d_2$ of material from the other side in order to form shelf 96 and complete separation of holder 90 from the wafer. Note that in general, two different thicknesses or levels may be provided in a tool plus through holes using a single patterned photo resist application and etch from each side of the wafer. Alternatively, multiple mask and etching steps from each side of the wafer may be employed to accomplish the same result if proper registration is maintained, and if appropriate steps are taken to assure that the second or subsequent layers of photo resist material applied to a surface after etching adhere properly to the surface.

While the manner in which photo resist to used achieve the lens holder 90 structure has been shown and described, those workers having ordinary skill in the art in light of the disclosure provided herein will appreciate that the other structures shown and described herein may be formed in analogous manner and that other structures and shapes may be fabricated using the techniques described herein.

With further reference to FIG. 6, having now described in detail the manner in which patterned photo resist is applied to the two sides of the wafer and the wafer etched to produce a tool, such as the lens holder 90, having the desired features, we now continue the description of the over all fabrication process. After pattered photo resist has been applied to the first side 71 of the wafer (FIG. 6a, Step 41), the first side 71 is etched, such as by ion etching, to the desired depth (FIG. 6b, Step 42).

Figures 1, 6A:
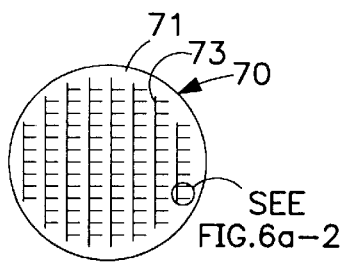
Figures 2, 6A:
Figure 6B:
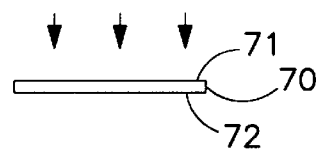
FIG. 6 is a diagrammatic illustration showing procedural steps in an embodiment of a method for manufacturing micro-machined structures by patterned masking and ion etching of silicon.
Figure 6C:
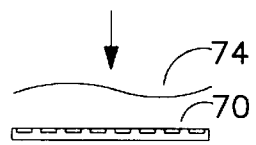
Figures 1, 6D:
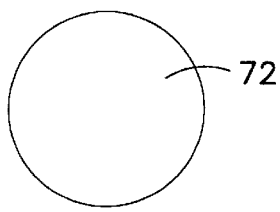
Figures 2, 6D:
Figure 6E:
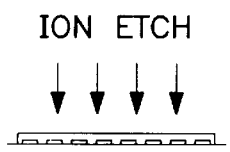
Figure 6F:
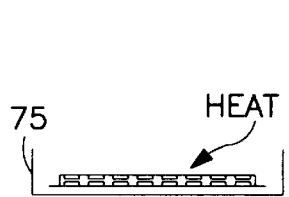
Figure 6G:
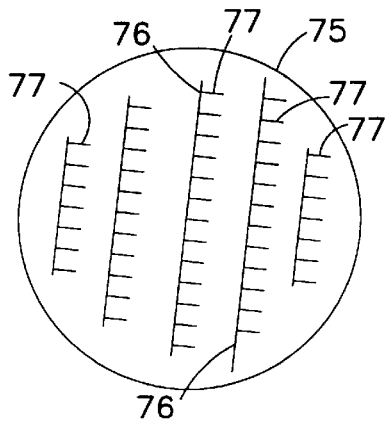

As illustrated in FIG. 6c, a different patterned photo resist is applied to the second side 72 of the wafer (FIG. 6c, Step 43). A heat release tape 74 is applied to the etched first surface (FIG. 6d, Step 44) and acts as a binding means to support the wafer during the next processing stages. Other conventional techniques and means for holding the wafer may be employed as known in the art, and though not preferred, the use of heat release tape or other binding means may be eliminated, though damage-free recovery of the separated tools after the second etching may be problematic. The wafer is again etched to the desired depth (FIG. 6e, Step 45). At this stage in the process, the individual semiconductor tools 77 (or strips of tools if a connecting strip 76 has been provided) are supported and held together only by the heat release sheet material or tape 74. (Optionally, some interconnecting structure could be retained, that is protected from etch, that would support each of the tools on a silicon wafer framework for subsequent separation.) The tape supported tools are maintained in or placed in a container or other receiving structure and heat applied (FIG. 6f, Step 46) to release the tools 77 (or tool strips 76, 77) from the release tape. The sheet material has high adhesive strength at low temperatures and loses its adhesive properties upon application of heat for a predetermined period of time, typically about 150° C. for about 1 minute. The heat release tape or sheet material leaves little, if any, residue on the parts after release. The use of heat release tape in semiconductor processing, such as the product Revalpha Thermal Heat Release Sheet made by Permacel, a Nitto Denko company of New Brunswick, N.J., is known in the art and not described further here. The tools or strips of tools are then recovered after release from the tape for subsequent storage and use (FIG. 6g, Step 47).

The retention of connecting strips 76 may facilitate handling, such as by using automation equipment to break or cut a tool 77 from the strip just prior to use. Maintaining the tools on a stip provides a somewhat larger structure for handling and eliminates the need to "pick up" and orient the tool prior to use. Maintaining the tools on a strip also keeps the tools separated so that they are not damaged by mechanical collisions with each other that could otherwise occur if they were stored in a pile.

We now turn our attention to a discussion of material properties, and more particularly to the properties of crystalline silicon (Si) that make silicon a particularly attractive material for the inventive structures. First, single crystal (SC) silicon is one of the purest materials available commercially. This partially results from its elemental nature, and partially results from its widespread adoption for electronic circuits, which makes incredibly pure silicon boules and wafers available at low cost. Silicon can be grown into a virtually perfect crystalline form with few defects. Unlike metals, including elemental iron or metal alloys, silicon has the same form and composition from all sources. The constancy of silicon's composition means that it has a constant modulus of elasticity. Advantageously, crystalline silicon does not exhibit plastic yield, rather it bends until it reaches fracture and then breaks. This characteristic provides a very predictable fracture characteristic and allows the handle to be broken from the assembled structure without subjecting the assembled structure to excessive force, such as force that might damage the structure or cause the adhesive holding the just assembled part to the assembly to fail. The techniques developed for semiconductor wafer processing are readily adaptable to handling the inventive structures.

Given these physical properties, the width and depth (e.g. size) of the notches in the break-away holders can be readily adjusted to control fracture to a narrow predetermined range of fracture force. The angle or direction of the fracture can also be readily controlled by controlling the shape, orientation, or other physical characteristics of the notches. The thickness in either dimension, and the cross-sectional profile or area of the neck may also be selected to provide the desired fracture characteristic.

While we have described the advantages of silicon, the inventive structure and method are not limited solely to silicon tools, or even to tools made by the particular method described here. Where the break-away feature is not required, the material merely needs to be capable of being fabricated according to the method described herein, that is the photo resist patterning, etch, patterning, etch, technique. For example, other base materials, such as silicon nitride, silicon dioxide, glass, germanium, gallium arsenide, or aluminum may be used and produced using the patterning and deep reactive ion etching procedures described herein.

Alternatively, the structures may be made of other material, such as for example, stainless steel, aluminum, silicon, brass, or titanium. In these instances, the tools would for example be fabricated using wire EDM to stencil each tool from a larger substrate.

Another alternative fabrication technique involves plating a material (such as for example, copper, permalloy, or gold) onto a base material (such as for example, silicon or glass) and then patterning and etching the substrate wafer to form and release the parts.

The tools may also be fabricated by etching a noncrystalline material such as stainless steel or other metal using an electrochemical etching technique. Electrochemical etching has been used to fabricate much larger structures, such as the structures associated with magnetic disk drive suspension components (for example for the suspension arm and gimbal); however, such structures have dimensions on the order of from a several millimeters to tens of millimeters.

While these alternative techniques and/or materials are available, they are not generally preferred because they typically do not permit attainment of the small feature size and precision associated with the ion etching of monocrystalline silicon. Furthermore, at the time of writing, at a cost of about $200 per processed 100 mm diameter wafer, and projected yields of 500 to 5000 parts per wafer (depending on shape, and size), the cost per tool is only about a few cents (about $0.04 USD) to fractions of a dollar (about $0.40 USD).

Figures 9A, 9B:
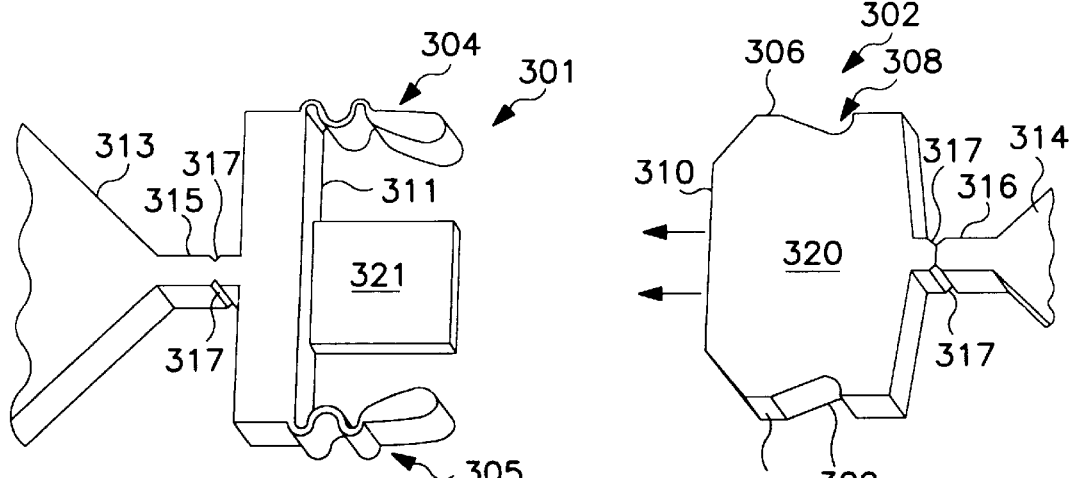
FIG. 9 is a diagrammatic illustration showing an embodiment of an exemplary two-part matable holder with integral securing spring clips, each of which includes a break-away handle.
Figure 9C:
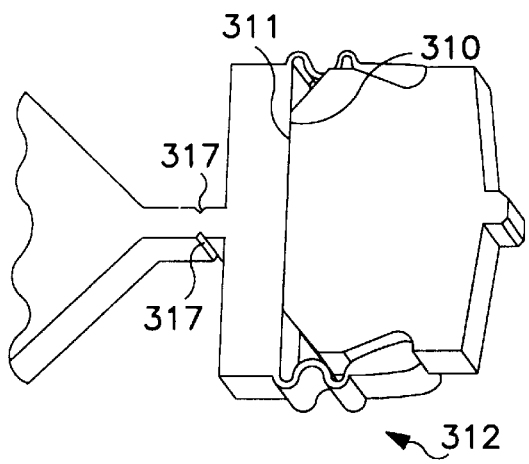

Having described the lens holder 90 with break-away handle and the method for making and using same, we now direct our attention to describing several other exemplary removable tools and break-away holders according to the invention. In FIG. 9, a pair of mating structures 301, 302 which are slidably connectable to each other, and once pressed together are held by spring clips 304, 305 integral to the receiving part (female part) 301 which press against and slide over first 306 and second 307 side surfaces of the inserted part (male part) 302 and which are subsequently captured by depressions 308, 308 in the inserted part 306 when the inserted part is fully inserted. In FIG. 9a, the receiving part 301 is illustrated, while the inserted part is illustrated in FIG. 9b. The connected combination 312 of the mating inserted 302 and receiving parts 303 is illustrated in FIG. 9c.

The particular mating structures illustrated are essentially the mounting block for another component, such as a mounting block for other optical, electrical, or mechanical components such as lenses, mirrors, coils, and the like. Variations to the base mounting block may be made to accomplish the particular function desired. For example, a through hole may be provided in the body 320 of the inserted piece 306 to hold an optical lens, and a comparable through hole would then be provided in the guide tab 321 so that once the two pieces were matingly connected the two holes would align. Typically, one piece 301 would be assembled to the larger optical assembly and, if an adhesive were used, once the adhesive had cured, the second component would be mated to the first. Of course more than two pieces may be coupled together in the manner described.

This particular spring clip design permits the inserted part to be removed even after the clips 304, 305 have latched onto the recesses 308, 309, but other clips may be provided with features that preclude subsequent removal once inserted, or removal only with a large force. Advantageously, the particular design of the clips and recesses in the FIG. 9 embodiment, gently urges the front surface 310 of the inserted piece 306 to the back wall 311 of the receiving pocket so that the pieces tend to stay together. This spring bias feature may be advantageous for maintaining optical alignment and simplifying assembly.

Significantly the particular exemplary embodiment of the spring clip tools illustrated in FIG. 9 are formed in silicon using the aforedescribed DRIE procedure. Each of the two mating pieces 301, 302 is connected to its own respective handle 313, 314 by a breakable neck portion 315, 316 which in the illustrated embodiment includes stress concentrating opposed v-notches 317 or grooves.

Figure 10:
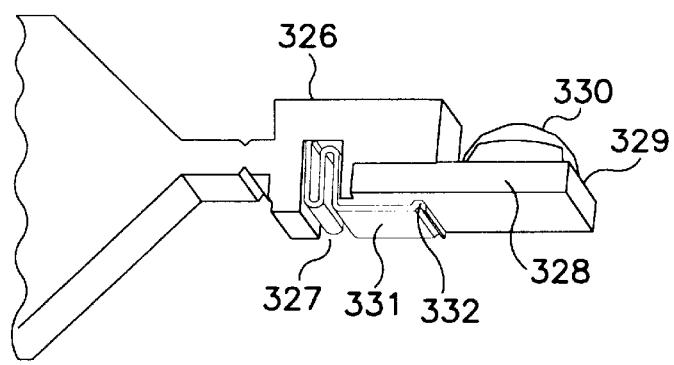
FIG. 10 is a diagrammatic illustration showing another embodiment of an exemplary holder with integral securing spring clips for securing a lens with the holder and still retaining a break-away handle.

Another embodiment of spring-loaded mating connectors is illustrated in the embodiment in FIG. 10, where there is shown a break-away type holder 326 having a pleated-type spring clip 327 disposed to receive and hold a flat plate section 328 of an inserted molded lens 330. A linear protrusion or ridge is also provided at the end extremity of a moment arm 331 attached to the spring 327 so that the spring force is applied at the desired location against the inserted holder 329. Advantageously, the ridge 332 is rounded to facilitate insertion of the two pieces. In this embodiment, the holder 326, has a different shape than the holders in the embodiment illustrated in FIG. 9. Also the springs have different numbers and tightness of pleats. Altering the geometrical properties of the spring section which is formed integral with the block allows the spring properties to be very finely tuned.

Figure 11A:
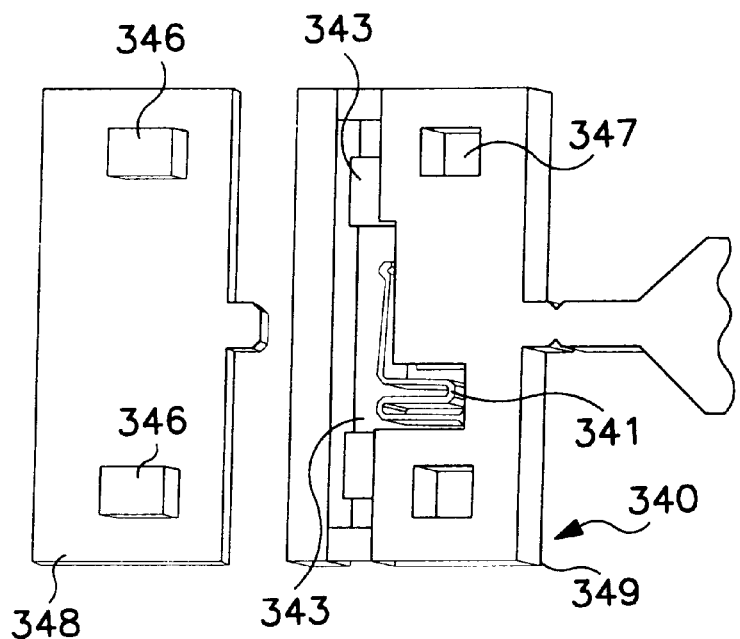
FIG. 11 is a diagrammatic illustration showing an embodiment of a longitudinal fiber holder having an integrally formed fiber retaining spring and peg and hole construction to provide precise alignment of the two pieces during and after assembly.
Figure 11B:
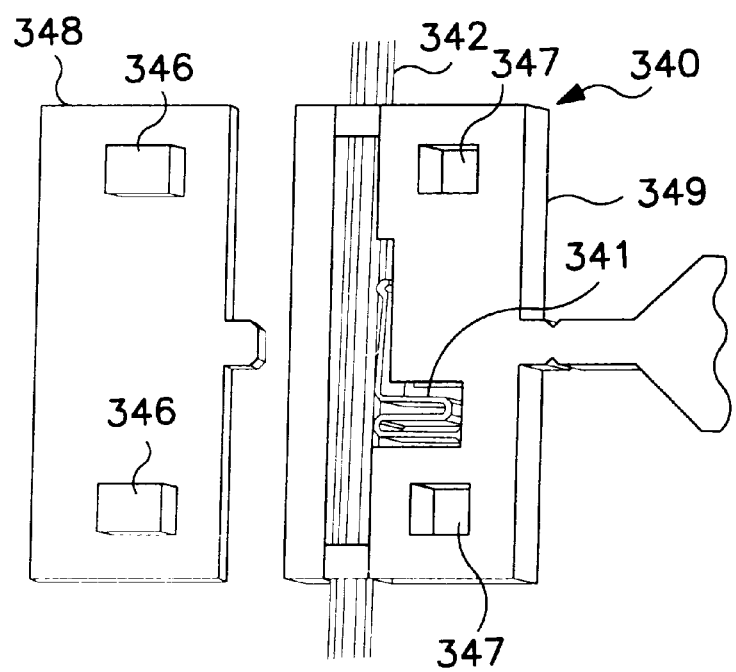
Figure 12:
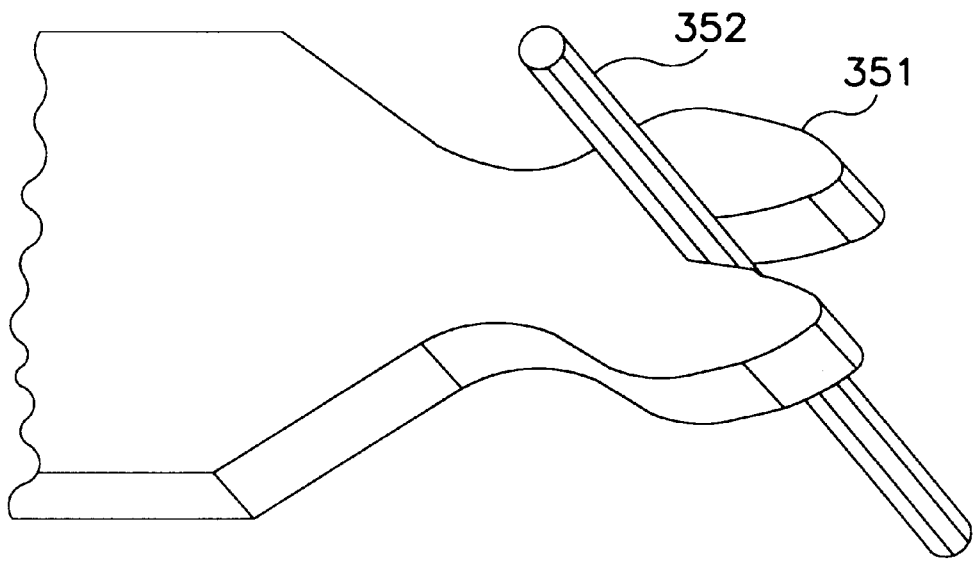
FIG. 12 is a diagrammatic illustration showing an embodiment of a removable tool.

Another embodiment of a fiber-mounting tool 340 having a spring clip 341 is shown in FIG. 11, where the silicon spring 341 is used to hold the longitudinal position of an 80 micron diameter optical fiber 342 in a channel 343 formed in the fiber-mounting tool 340. This embodiment of the invention includes additional precision position locating pegs 346 and holes 347. FIG. 11a illustrates the fiber mounting tool 340 prior to insertion of optical fiber 342, while FIG. 11b illustrates the structure after installation of the fiber.

Typically the base portion 348 is first mounted to the larger optical head assembly with adhesive, then after the adhesive has cured, the fiber carrying upper section is positioned so that the holes 347 are aligned over the pegs 346, and the upper and lower portions pressed together. Adhesive may be applied during assembly to set the pieces permanently in place. Alternatively, the peg/hole structure may be used in conjunction with one or more springs so that the two parts are securely but removably held in position.

Figure 13:
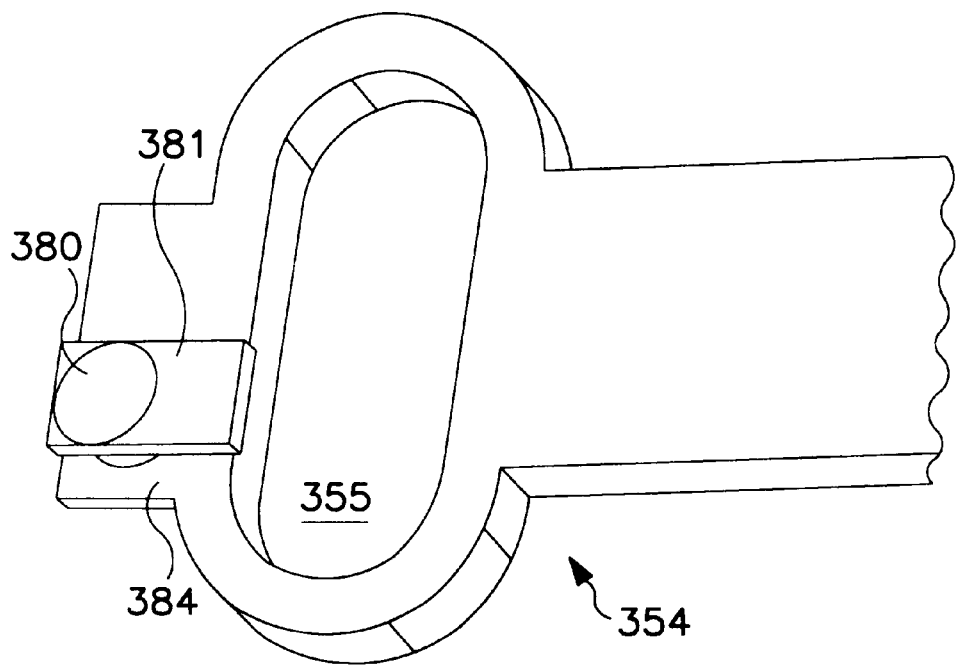
FIG. 13 is a diagrammatic illustration showing an embodiment of another removable tool having a cut tab.

Embodiments of various other removable tools and break-away holders are illustrated in FIGS. 12–17. For example in FIG. 12, a removable tool 351 for holding and positioning a fiber 352 is illustrated. In FIG. 13, a removable tool 354 for holding molded lens 380 is illustrated, which has tabs 355 cut after attachment to a larger optical assembly by cutting means such as a saw, laser, or equivalent cutting means.

Figure 14:
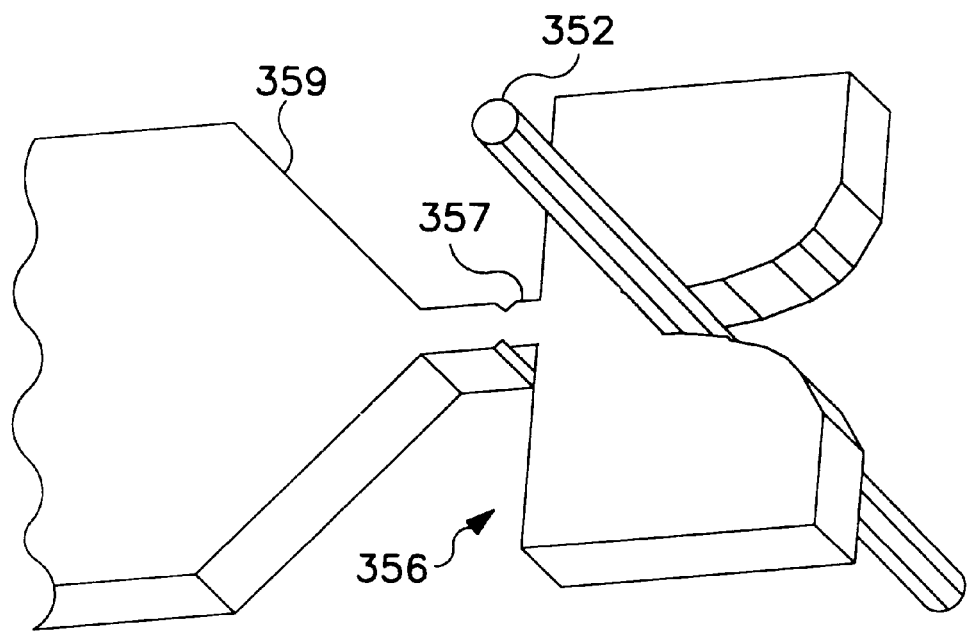
FIG. 14 is a diagrammatic illustration showing an embodiment of a fiber alignment tool with orientation key.

In FIG. 14, a break-away fiber alignment key 356 provides means for rotating the fiber 352 and once the fiber is set in place, the handle 359 may be broken away to leave a vestigial alignment key in the form of the perpendicular faces and the remaining neck fragment that may be used to align other holders or optical/mechanical elements.

Figure 15:
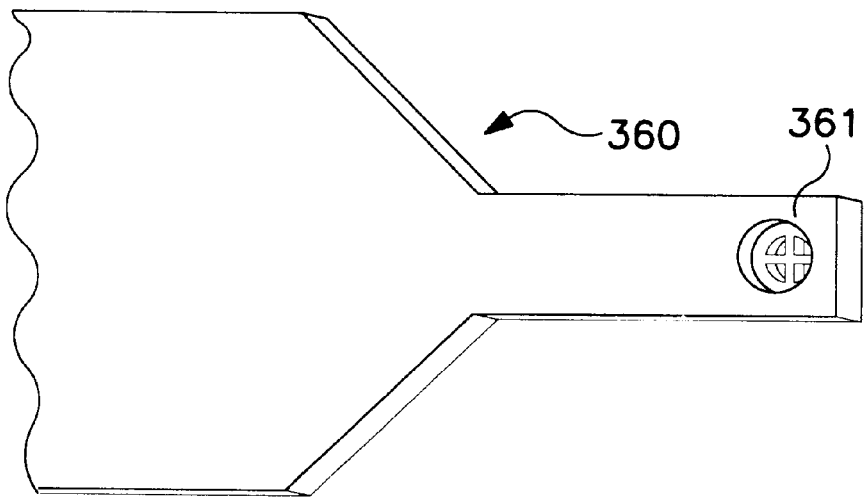
FIG. 15 is a diagrammatic illustration showing an embodiment of a removable alignment target tool.

In FIG. 15, a removable alignment target tool 360 having an alignment target 361 at one end is shown. The particular target is merely exemplary, and those workers having ordinary skill in the art will appreciate that many other targets, stops, apertures, mirrors, reflectors, or the like can be placed at the tip of a removable tool. Furthermore, while many of the removable tools are illustrated as having substantially linear shapes from the handle to the tip, the tools may more generally have angled portions, curved portions, and so forth without limitation.

Figure 16:
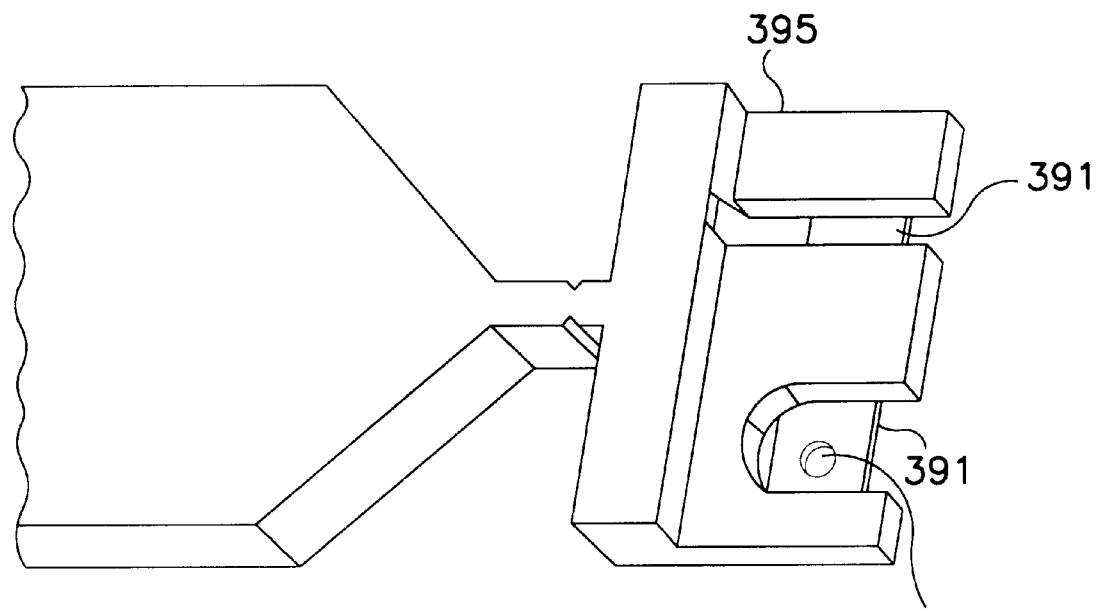
FIG. 16 is a diagrammatic illustration showing an embodiment of a break-away magnetic coil holder with an attached electrical coil assembly attached thereto.

The structure illustrated in FIG. 16 is an embodiment of a coil assembly holder. Coil assembly 391 having an aperture 392 concentric to the location of the coil through which an optical beam may pass. The coil assembly block 391 has been adhered to the break-away mounting block 395 by use of an adhesive, such as a UV initiated fast curing adhesive.

Figure 17:
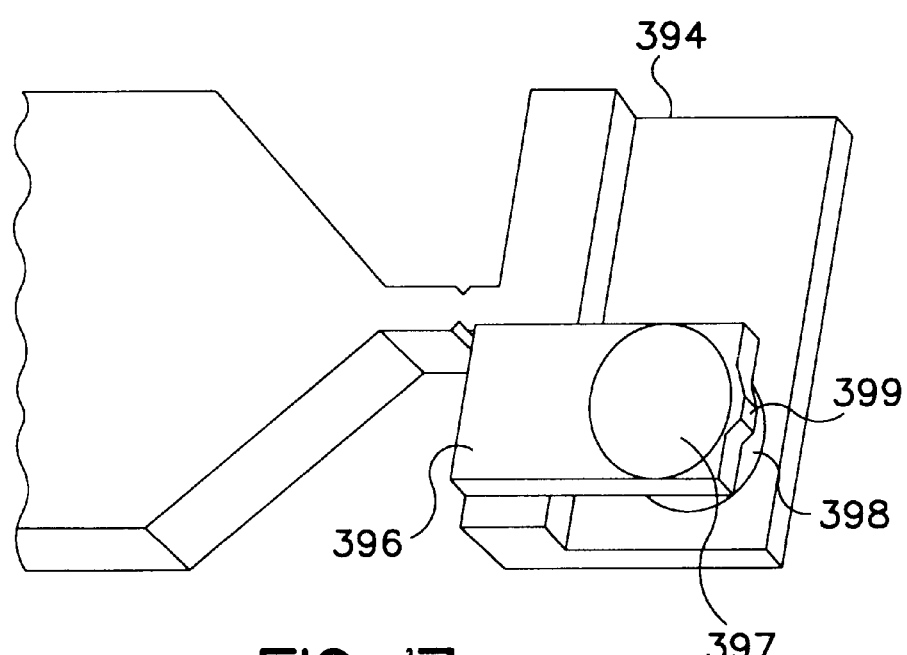
FIG. 17 is a diagrammatic illustration showing an embodiment of a break-away lens holder with the lens attached.

The structure illustrated in FIG. 17 is an embodiment of a lens holder. The lens 397 is aligned above aperture 398 in the mounting block 394. A vestigial portion of a break-away neck 399 is shown on a vertical wall of mounting block 396.

Removable tools and break-away holders (also a type of tool) of sort already described may also be fabricated using alternative techniques. For example, in addition to the embodiment of the inventive method involving patterned photo resist masking and etch, a substrate may be plated with a metal such as copper, permalloy, gold, and combinations of these materials, as well as other conventional plating and deposition materials. The substrate may be a semiconductor material such as silicon, or it may comprise other materials such as stainless steel, aluminum, titanium, or other metal, or amorphous solids such as glass, or even poly-crystalline materials. Of course not all materials may be suitable for all tool or break-away holder applications. The material is advantageously chosen to provide the desired combination of mechanical properties, and due consideration may also be given to economic factors such as the raw material cost and associated processing costs. When the tool is plated, such plating may be accomplished by any of the conventionally available plating or deposition techniques. Furthermore, additives or impurities may be deposited into a base material, such as silicon, using conventional ion implantation techniques. These ions may advantageously modify the material properties of the tools for a particular application, such as by modifying the surface hardness, fracture point, or to in some manner passivate it relative to the item to be held of manipulated.

Another alternative structure involves plating or depositing a layer or layers of material onto a base substrate material, and then removing the base material such as by etching. For example, a silicon base material may be etched by Deep Reactive Ion etching to leave only a plated layer. Since the plated or deposited layer may have a thickness comparable to the base material thickness, this effectively substitutes or replaces the material (e.g silicon) with another material (e.g. copper).

An additional structure for the inventive tools and holders involves forming such tools from etched metal, for example, electro-chemically etched metal. The etched metal may for example comprise stainless steel, aluminum, titanium, or the like, or combinations or alloys of these or other metals.

Embodiments of a plated metal structure and process are now described. While the description is provided relative to cross sectional areas, it should be understood that the layers may be provided in conjunction with any device and that in particular, the devices may be, but are not limited to, the aforedescribed holders and tools.

In general terms, selective plating is a process whereby metal is deposited in an electroplating bath or other means, typically on a substrate with a so-called plating base, a thin film of metal upon which the plating can proceed, partially protected by a photolithographically defined masking layer. Photoresist technology allows for aspect ratios, that is, the height of a defined feature divided by its width, to typically be on the order of from about 5:1 to about 10:1, though higher and lower ratios can be accommodated. Thus a 5 micron wide feature, either a slot or an isolated line or post for example, can have a height from about 25 micron to about 50 micron high with a thick photoresist such as SU-8, described in U.S. Pat. No. 4,882,245 by Gelorme, et. al. which is herein incorporated by reference, or the AZ-4562 photoresist material made by AZ Electronic Materials of Sommerville, N.J.

The plated metal closely follows the photoresist walls during deposition, and plated metal features with the same or substantially the same aspect ratio as the photoresist features are thus produced. Typically the photoresist material is removed following the plating, leaving the metal features on the substrate and plating base. Typically the plating base is removed, for example by wet chemical etching, leaving just the plated features on the substrate.

In FIG. 18 there is illustrated a section from a microminiature lens holder 602. To make this inventive lens holder structure 602, one or more plating steps are performed on, for example, a silicon substrate 604 to produce the plated metal structure. In one embodiment of the process, a plating base 606 is deposited on one surface 608 (for example the top or front surface) of a silicon substrate 604. An optional first photoresist pattern 612 is provided on the back or bottom surface 610 of the wafer substrate 604 which will later be used as the etching mask 616, and a second photoresist pattern 614 is provided on the top surface which will define the metal mask 618. The bottom photoresist layer is optional in that it is only required when a non-planar lower surface on the tool is required, because the lower photoresist layer 612 allows for differential etching of the substrate. Differential etching is not needed for a flat or planar surface, such as when the entire substrate is to be removed.

Figure 18A:
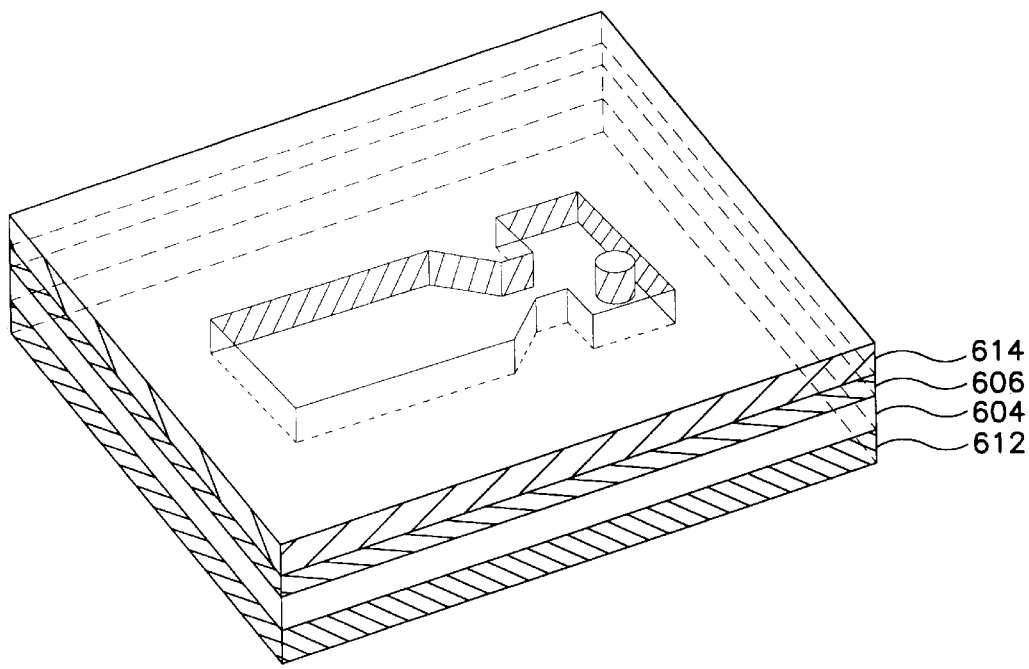
FIG. 18. is a diagrammatic illustration showing an embodiment of a process and the resulting structure for forming a structure using plated metal.
Figure 18B:
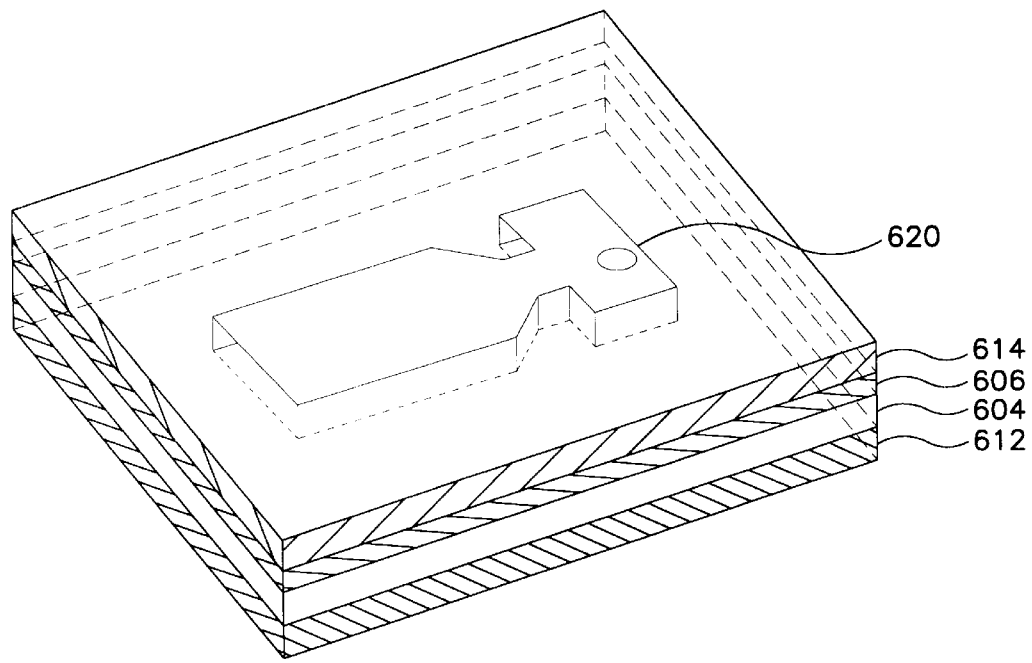
Figure 18C:
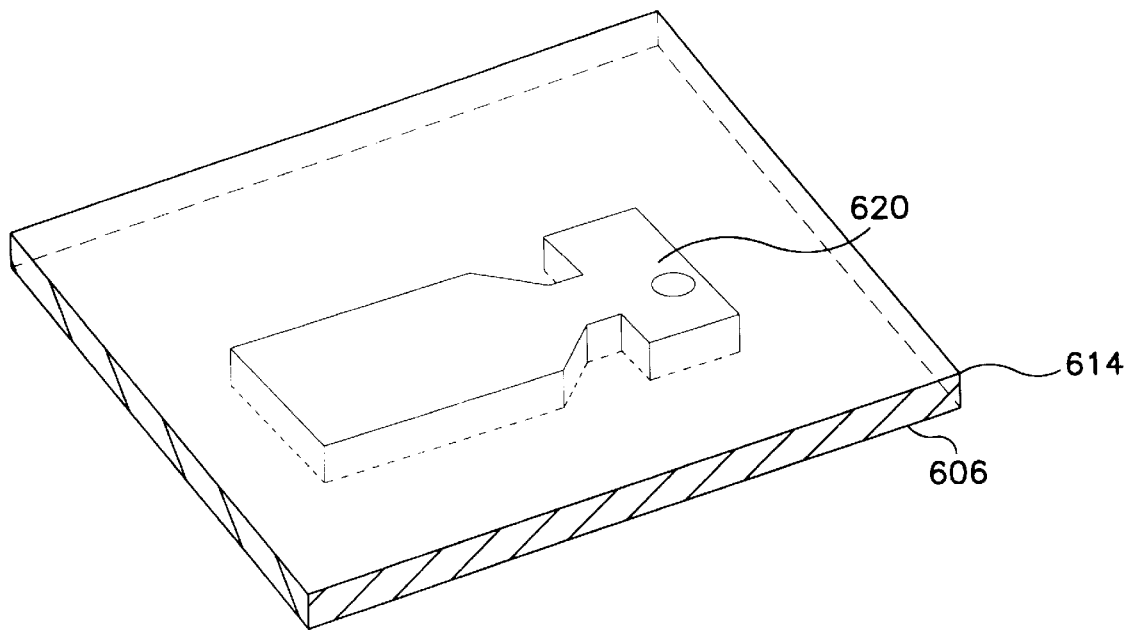
Figure 18D:
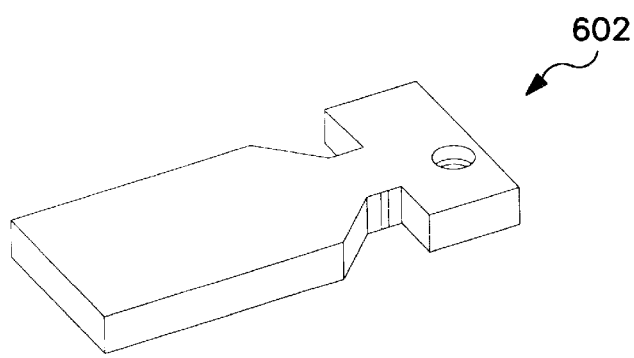
Figure 19A:
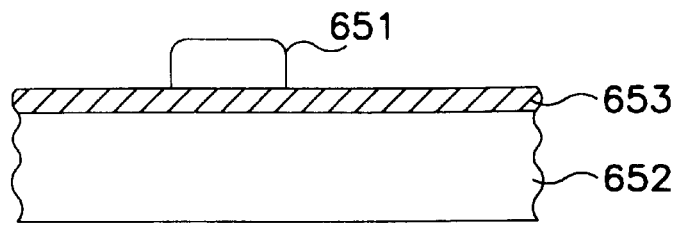
FIG. 19 is a diagrammatic illustration showing an embodiment of a process and the resulting structure for forming a tube structure.
Figure 19B:
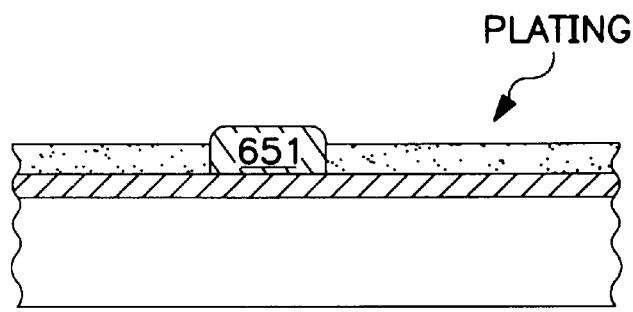
Figure 19C:
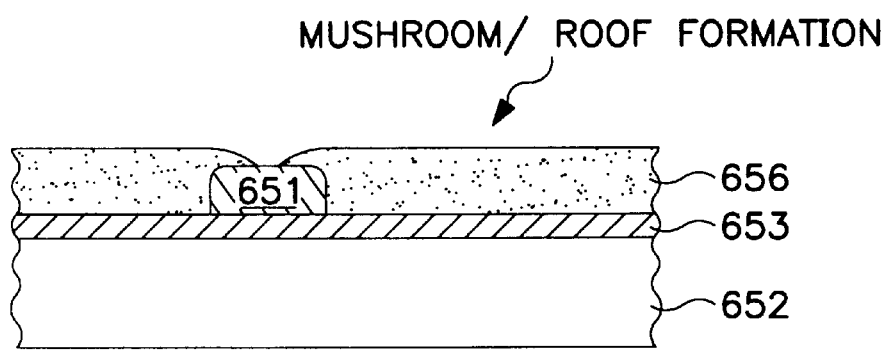
Figure 19D:
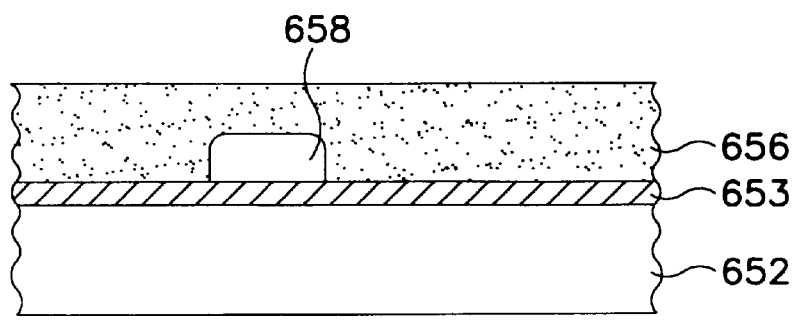

These two photoresist layers 612, 614 can be formed simultaneously in a so-called front/back mask aligner, or sequentially, both of which techniques are known in the art depending on the equipment available. The metal material 620, may typically be nickel, but may alternatively be gold, permalloy, copper, or other metals, is plated on the plating base first, followed by the etching of the substrate 604 and the removal of top and bottom photoresist layers 612, 614. The metal layer 620 may be plated to the desired depth, and that depth may underfill the photoresist layer 614, fill the photoresist layer 614, or overfill the photoresist layer 614. The exemplary structure in FIG. 18*b* is shown as filling the photoresist layer 614. In general, metal plated structures made in this manner can provide all of the structural and shape elements described previously for two-sided etching technology, including the holes, springs, clips, datum walls, slots, grooves, mating elements, and "break-off" features of the including the various holders and tools. The silicon substrate and photoresist layer(s) may be entirely removed (FIG. 18*c* and FIG. 18*d*) leaving only the metal structure, or portions of the substrate may be left to form a composite structure. The final structure of a holder wherein all of the substrate has been removed is illustrated in FIG. 18*d*. In addition, structures may be plated on one side of the substrate, then the substrate may be selectively etched away from the bottom side.

There is one set of parts, including tools and holders, that can be made with one layer of plated metal and substrate back-side etching. There are other parts that can be made by plating metal on the front side and etching from both the front side and back side, but front-side etching of the substrate is limited in that it cannot etch under the metal layer from the front side. Other combinations of front-side etching, back-side etching, and single or multi-layer metalization may be used.

One may alternatively etch partially into top layer (without etching through the substrate) where there is no metalization, and also etch partially into or entirely up through substrate from the back-side (non-metalized side). This embodiment of the invention can be useful for undercutting the substrate from a metal layer to form cantilever features of the metal structures, or to produce through holes, and the like.

Another embodiment of the inventive method involves first etching and then metal plating; however, this technique may present a planarization problem in later photo lithographic process steps. The steep walls and uneven topology of the etched surface may be problematic (for example, the photoresist may not cover very well) unless some intermediate filler is used. Filler may be photoresist, glass, and the like. After filling and polishing to renew a planar surface, the metal layer may be applied as described.

Advantageously, the use of a metal structure or the inclusion of the metal layer on a semiconductor substrate allows a wider variety of material choices which can offer additional structural and/or functional benefits and alternatives. The metal's mechanical behavior is much different that silicon or most other semiconductor materials. For example, as a metal spring will not normally fail by brittle fracture, but will gradually yield when strained beyond its elastic limit. This can be advantageous for some types of press-fit connections or spring retainers, where the yielding behavior is needed to allow the correct interference fit. The metal layers can also be magnetic, have very high electrical conductivity, allow for laser welding or soldering of components to the holder or for the holder to the substrate, or have a higher thermal coefficient of expansion to provide either for controlled bimetallic motion to thermal inputs, or to more closely match the thermal expansion of an assembly. In some devices metal may be used to realize one or several of these features and the metal itself may be chosen to optimumly provide the desired physical or process characteristic.

The inventive process also enables a tube, box, or slot structure to be formed using plated metal. An isolated photoresist line 651 (shown in cross section in FIG. 19) is provided on a substrate 652 with a plating base 653. The metal 656 is then progressively plated onto the plating base 653, and the plating is allowed to grow and extend over the top of the photoresist layer 651 on each side of the photoresist line or deposit 651. The plating material eventually "mushroom" over the top of the isolated line so that the plating on each side of the line merges or joins to form a continuous roof and enclose the photoresist line 651 with plated metal 656. The photoresist can still be removed from "inside" the metal by wet stripping or plasma etching from an exposed regions (wet stripping and plasma etching techniques are known in the art and not described further here), forming the tube, box, or slot-like structure 658. Such a tube structure can capture a complementary shaped pin to form an in-plane alignment or capture feature. Photoresist depositions other than lines may be provided in analogous manner and then plated with subsequent removal of the photoresist to form other concave structures which may similarly receive or mate to complementary shaped structures on other pieces.

Holders and tools having somewhat more complex or elaborate features may be formed using another alternative embodiment of the inventive method. The more elaborate features may include but are not limited to, for example, a wider variety of shapes and contours. In these embodiments, an oxide layer is deposited on the top surface of the substrate and then patterned with photoresist. The desired structural features are then plated on top of the oxide layer. The photoresist deposition and plating procedures and structures are the same as already described relative to the other embodiments. After plating, the substrate is etched from the bottom surface and the photoresist is removed from both top and bottom surfaces. What remains is a metal structure having an oxide layer on its lower surface. The previously "buried" oxide layer, which is again exposed after substrate etching, may be used as a layer to which additional deposition and etching techniques may be applied.

The advantage of using a buried oxide layer is that it provides a patterned etch mask for use in etching the non-planar high-topology relief structure when photo lithographic patterning is problematic. The buried oxide is patterned but hidden for the time being. The plating base is applied to the oxide and then plated with the metal layer(s). The oxide acts as a hidden etch mask. When the photoresist and plating base are stripped away, a patterned oxide layer is exposed and vulnerable to the etch. In this manner, the plating can be built up in a variety of shapes, patterns, and topological reliefs. Once the high degree of relief has been established on the substrate, it is undesirable to have to use photo lithographic techniques on the high relief structure. Rather, the oxide acts as a silicon etch mask for a plasma etcher, and photolithography need not be relied upon. One builds up any amount of plated layers desired, then performs the silicon etch at the end. This technique may be used for example, to generate a hole in the substrate, or etch away the part at the end. While one cannot etch through the metal feature on a part, one can etch all around it.

The plating base may have a composition identical to the metal to be plated, or merely a material that is compatible with the metal to be plated. The plating base material may for example be deposited by sputtering, vapor deposition, or other known methods. The plating base may typically be deposited to a depth of for example, a few thousand Angstroms. While the entire metal layer could conceivably be deposited by sputtering, vapor deposition, or similar techniques, deposition of the relatively thick metal layer (for example a few to ten's of microns for some embodiments) by such techniques is impractical because of the time and expense involved. More usually, either electroless plating or electroplating are used to build up the layer or layers, with electroplating being the preferred technique. Electroless plating is useful only as a seed layer as the thickness is generally limited to a micron or less thickness. The selection of materials for electroplating is greater than electroless plating and the thickness of the plating can be determined during the process by monitoring the current flow through the plating bath.

One can usually afford to remove a little of the metal layer when removing the plating base, however if there is a need or desire to avoid removing any of the metal layer, then a different plating base may be used that can be removed later without removing any of the metal layer.

If it is necessary to avoid removing any of the metal layer when removing the plating base, then it is desirable to use compatible metals for the base material and metal layer. For example, a base layer of copper may be used on which is plated a layer of gold, or may gold may be plated on nickel. Other combinations are possible, as known in the electroplating art. Then, a metal etchant is used that will etch the plating base material (e.g. copper) without etching the metal layer (e.g. gold). For example there are a number of etchants that will etch nickel but not gold. These compatible combinations are well known in the plating art and not described further here.

Figure 20:
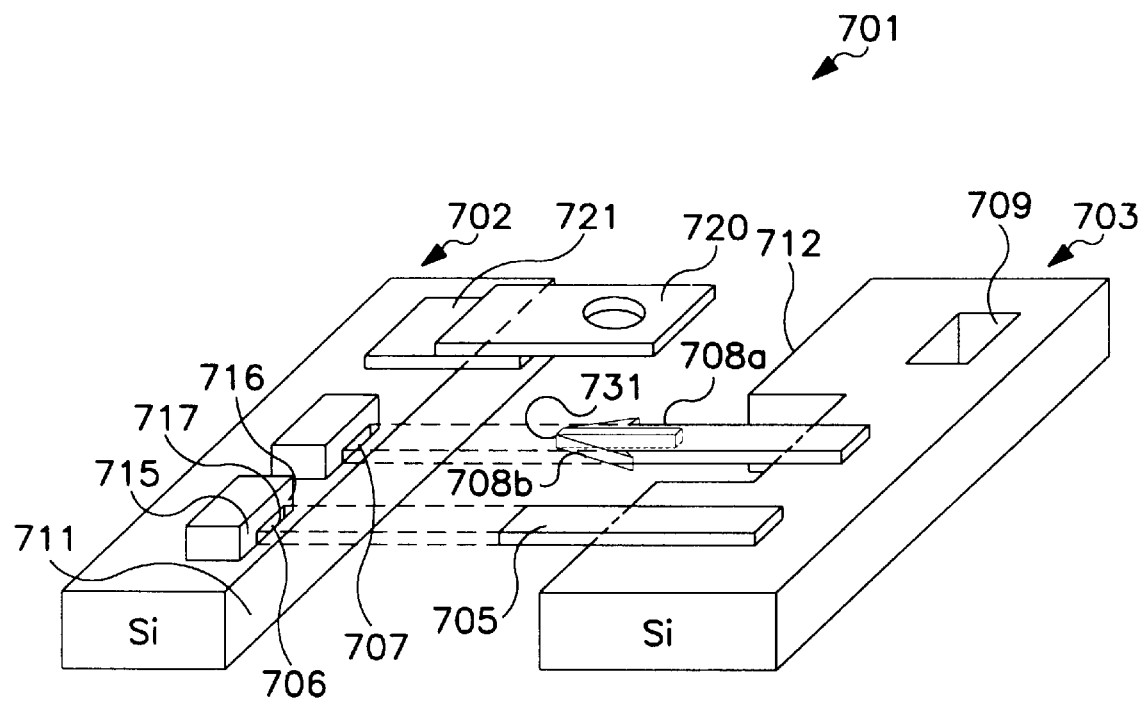
FIG. 20 is a diagrammatic illustration showing an embodiment of a structure having multiple metal layers.

Another process variation includes a second (or subsequent third, fourth, fifth, etc.) plating process following a first (or earlier) plating process, and providing a second (or subsequent) plated layer on top of the first (or earlier) plated layer. This permits fabrication of a structure 701 such as illustrated in FIG. 20 having a wide variety of ridges, overhanging features 705, slots 706, 707, grooves, pins 705, clamps, springs 708, holes 709 and the like features which cannot readily be formed using conventional techniques or even using embodiments of the inventive technique relying on a single metal layer. In this structure 701, two portions 702, 703 are adapted to be slidably coupled to each other in abutting contact about surfaces 711, 712. Alignment of the two parts is achieved by insertion of metal pin 705 which is formed here from a single metal layer on the silicon surface, into alignment slot 706, here formed via two metal layers, the first layer having a void region 716 separating two metallized regions 714, 715. This structure 701 has the advantage, among several already described, that the two components 702, 703 can attache in-plane with the metal plated features and align out-of-plane with alignment holes through the Silicon fixture.

Capture spring 708 is slidably insertable into capture slot 707, which is also formed from first and second metal layers as was the alignment slot. While the detail of the mating regions of capture spring 708 (springable portions 708a, 78b, and separating slot 731) and capture slot 707 may not be readily apparent from the structure in FIG. 20, it should be understood that these structures may for example have any suitable mating structures that would allow them to mate and remain locked together, or locked in a releasable manner. For example, mating structures 301, 302 such as illustrated in FIG. 9 may be formed in the metal. The structure 701 also provides an overhanging metal plate 720 which is itself cantilevered over a first metal layer 721, and which extends laterally from the first component 702 to overhang an aperture 709 in the second component 701, so that the aperture (here a holder for an optical lens—not shown) is aligned with aperture 709 and at a predetermined distance or height above the hole 709. Of course these particular structures are merely exemplary of some of the structures that may be formed using the inventive process.

Figure 21:
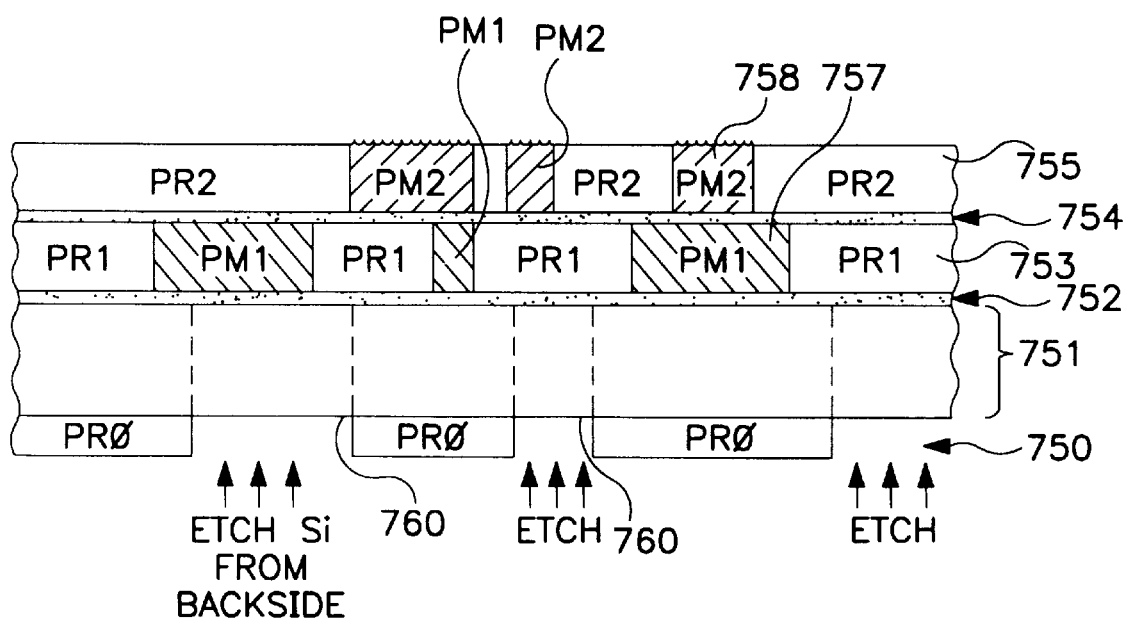
FIG. 21 is a diagrammatic illustration showing another embodiment of a process for forming a structure using plated metal.

In this embodiment of the inventive process which is now described relative to FIG. 21, a bottom patterned photoresist layer (PRO) 750 is applied to substrate 751, here silicon. Then the top surface is plated with a first plating base material layer 751. Another patterned photoresist layer (PR1) 753 is then applied to the top substrate surface on top of the plating base 752. A first metal layer 757 is then electroplated onto the exposed regions of the first plating base 752 to about the level of the top of the first upper surface photoresist layer (PR1) 753. An additional second plating base 754 is then deposited on top of the existing first photoresist (PR1) 753 and first plated metal layer (PM1) 757, and a second plating photolithography process is then performed on this second plating base surface. That is photoresist (PR2) 755 is applied and then second plated metal layer (PM2) 758 is applied up to about the level of the second photoresist.

After the second metal layer 758 plating, the bottom surface 760 of the substrate 751 not protected by photoresist 750 is etched, and the top surface photoresist (PR1, PR2) and exposed plating bases 752, 754 are removed in conventional manner. A wide variety of ridges, overhanging features, slots, grooves, pins, clamps, and other features can be formed this manner such as those for example in FIG. 20. We note that the structure illustrated in FIG. 21 is exemplary of the process, and the final structure does not correspond to the particular features in FIG. 20 or to a particular feature topology.

The foregoing description has identified numerous embodiments of the inventive structure and method, however those workers having ordinary skill in the art will appreciate that the invention is not limited to the particular embodiments described in detail in the specification.

For example, the invention includes a micro-miniature tool for manipulating a first miniature article relative to a second miniature article, said tool comprising: a manipulator portion for interacting with said first article to be manipulated; an elongate handle portion integrally formed with and extending from said manipulator portion and adapted to be held by an external positioning means; said tool adapted for accessing and interacting with said first article to be manipulated in a confined space proximate said second article; said tool including a base material; and said manipulator portion adapted to interact with a physical feature of said first article having a size dimension less than 500 microns.

In a further embodiment of the invention a microminiature tool is provided wherein said base material comprises a single piece of substantially mono-crystalline material. In another embodiment, said single piece of substantially mono-crystalline material comprises silicon. In another embodiment, single piece of substantially monocrystalline material is selected from the group consisting of silicon (Si), gallium arsenide (GaAs), germanium, doped germanium, doped silicon, and doped gallium arsenide. In another embodiment, said tool is formed from a thin wafer of said crystalline material. In another embodiment, said tool is formed from said wafer by etching said tool from at least one side of said wafer. In another embodiment, said tool is formed electrical wire discharge of a thin metal sheet or metallic layer. In yet another embodiment, said etching is by deep reactive ion etching. In another embodiment, said tool is formed from said wafer by wire electrical discharge machining.

In still another embodiment, said manipulator portion is adapted to interact with a physical feature of said first article having a size dimension in the range between substantially 5 micron and substantially 200 micron. In another embodiment, said tool is formed from a silicon wafer having a thickness less than about 400 microns. In even another embodiment, a plurality of said tools are formed simultaneously by deep reactive ion etching of a photo resist patterned single crystal silicon wafer, and said manipulator portion is adapted to interact with a physical feature of said first article having a size dimension in the range between substantially 5 micron and substantially 200 micron. In another embodiment, tool is adapted for removal from said first article and from said region proximate said second article after manipulation of said first article without substantial alteration of said tool. In another embodiment, In another embodiment, said tool comprises an optical alignment target. In another embodiment, said tool comprises an optical fiber holder. In another embodiment, said tool further comprising a neck portion interposed between said manipulator portion and said elongate handle portion, said neck portion having a smaller cross-section than either said manipulator portion or said handle portion and integrally formed with each. In another embodiment, said neck portion further comprises a break initiation site for concentrating stress in a local area in said neck portion when a force is applied to said elongate handle. In another embodiment, said neck has a substantially rectangular cross section with at least two generally opposed sides, and including substantially opposed crack initiation sites in the form of notches on said at least two opposed sides of said neck to concentrate stress when said breaking force is applied to the side of said handle. In another embodiment, said handle being separable from said manipulator portion when said manipulator portion is maintained in a substantially fixed position by an external holding force upon the application of a small breaking force applied to said handle to separate said manipulator portion from said handle portion within said neck portion.

In another embodiment of said tool, said tool comprising an optical fiber holder including a spring portion and a shelf portion, said fiber being held between said spring and shelf generally parallel to said wafer. In another embodiment, said removable tool comprising an optical alignment target for aligning an optical beam within a narrow channel. In another embodiment, said alignment target is adapted for aligning a collimated laser beam relative to a desired optical path. In another embodiment, said alignment target comprises target portion for interacting with said optical beam, and a handle portion attached to said target portion and extending away from said target portion to permit insertion of and positional manipulation of said target portion. In another embodiment, said target portion includes a target selected from the set of targets consisting of an aperture, a cross-hair, an optical stop, a holder for attaching another optical element, and combinations thereof.

In an alternative embodiment, the invention provides a break-away holder for holding an optical element during assembly in an optical assembly comprising: a mounting block for attaching an optical element; a breakable neck; and a handle connected to said mounting block through said breakable neck adapted for positioning said optical element in said optical assembly by manipulation of said handle by an externally applied force; said handle being separable from said mounting block after said mounting block is attached to said assembly upon the application of a small breaking force applied to said handle to break said neck.

In still another embodiment of the break-away holder, said breaking force is greater than forces generally encountered during in-use handling of said holder, including being greater than forces experienced during positional manipulation of said optical element in said optical assembly; and said breaking force is smaller than forces that would disturb the alignment of said optical element or of other elements within said optical assembly. In yet another embodiment of the break-away holder, said breakable neck including a crack initiation site of a surface of said neck to concentrate stress when said breaking force is applied to said handle. In yet another embodiment of the break-away holder, said breakable neck has a substantially rectangular cross section with at least two opposed sides, and including substantially opposed crack initiation sites in the form of notches on said at least two opposed sides of said neck to concentrate stress when said breaking force is applied to the side of said handle. In yet another embodiment of the break-away holder, said neck breaks under a local strain of between about 1% and about 5% local strain. In yet another embodiment of the break-away holder, said neck breaks under a local strain of between about 0.5 percent (0.5%) and about two percent (2%) local strain. In yet another embodiment of the break-away holder, said neck breaks under a local strain of approximately 1 percent (1%) local strain. In yet another embodiment of the break-away holder, said breakable tool is fabricated from a single crystal of material which breaks when the local strain reaches a predetermined strain value within plus and minus about 40 percent. In yet another embodiment of the break-away holder, said breakable tool is fabricated from a single crystal silicon material and the neck is constructed such that the neck breaks when the neck approaches 1% local strain. In yet another embodiment of the break-away holder, said part is substantially 0.2 mm deep, said handle is substantially 1 mm×3 mm, and said neck is substantially 0.08 mm×0.20 mm and has 0.015 mm deep opposed concave v-shaped notches.

In still another embodiment of the break-away holder, said mounting block is attached to said assembly by an adhesive, said handle portion being about 2.2 mm long, and when a force of substantially 5 mN (milli-Newtons) is applied to the end of said handle so as to flex said neck about said notches, a breakage force sufficient to break said neck at said notches is produced while generating only about 15 N/mm$^2$ of stress in an adhesive attaching said mounting block to said assembly. In yet another embodiment of the break-away holder, said removable tool comprises an optical fiber holder having a generally forked shape having two tangs separated by a notch for holding said optical fibre perpendicular to said wafer. In yet another embodiment of the break-away holder, said optical fibre holder providing means for holding said fiber close to an end tip of said fibre during attachment of said fiber end to an optical module using a curing adhesive. In yet another embodiment of the break-away holder, said break-away holder mounting block portion is adapted to receive an element selected from the group consisting of a lens, a coil, a fiber holder, a mirror, a prism, a grating, a magnet, and a pizeo-electric device. In yet another embodiment of the break-away holder, said element is mounted to said mounting block by fastening means. In yet another embodiment of the break-away holder, said fastening means including adhesive, mounting block integrated springs, press-fit, and combinations thereof. In yet another embodiment of the break-away holder, said holder includes orientation identifying means which remains with said tool after separating said handle from said mounting block at said breakable neck. In yet another embodiment of the break-away holder, said orientation identifying means comprises a mechanical key. In yet another embodiment Of the break-away holder, said mechanical key further provides means for coupling a second element to said optical module at an orientation defined by said mechanical key.

In yet another embodiment of said tool, said tool is a fiber optical holder for holding a polarization maintaining optical fibre, said forked shaped portion of said tool for holding said fiber being connected to said handle by a break-away neck, said tool being rotatable with said fiber attached to a desired polarization orientation relative to a reference orientation, said holder being adapted for permanent mounting in said desired orientation, said tool having a breakable portion which after intentional breaking provides an alignment key used for coupling the oriented fiber to other optical elements, said broken neck portion further providing an indicator of polarization alignment.

In yet another embodiment of said tool, said tool further comprising a layer of metal plated on a portion of said base material. In yet another embodiment of said tool, said metal plating substantially covers at least one planar surface of said tool. In yet another embodiment of said tool, said material comprises a material selected from the group consisting of: stainless steel, aluminum, silicon, glass, or titanium. In yet another embodiment of said tool, said metal plating comprises a plating material selected from the group consisting of: copper, permalloy, gold, and combinations thereof. In yet another embodiment of said tool, said base material is selected from the group consisting of: silicon nitride, silicon dioxide, glass, germanium, gallium arsenide, aluminum, and combinations thereof.

In yet another embodiment of the break-away holder, said mounting blocks are severed from handles by separating multiple tabs with a cutting device, said provision of multiple tabs providing greater support for said mounting block as compared to a single tab or breakable neck section, and allowing multiple sections of the holder to be separated individually. In yet another embodiment of the break-away holder, said optical tool includes an optical aperture directly fabricated into the silicon tool for use in an optical path.

In still another embodiment of the break-away holder, said holder further comprising capillary glue channels disposed on at least one surface to be attached to an external part, said capillary glue channels assisting in the distribution of small amounts of glue applied to ends of said capillary glue channels. In still another embodiment of the break-away holder, said holder further including mating spring-clips and notches for connecting multiple holders together to form a three-dimensional structure. In still another embodiment of the break-away holder, said structure further including holes and pegs perpendicular to the plane of the wafer for connecting multiple holders together and for providing precise alignment said holder and said component to said assembly.

The invention also includes an embodiment of the inventive method of fabricating a single silicon crystal tool by comprising: providing a substantially planar silicon wafer polished on each of two opposed surfaces; applying a patterned photo resist material to each of said opposed surfaces so as to define and expose the regions to be etched and the regions to be protected on each said surface; etching a first surface to a desired first etched depth; attaching said etched first surface to stabilizing means; and etching a second surface to a desired second etched depth; said first and second surface etching producing at least one feature selected from the group consisting of a wafer surface recesses, a plates, and a wafer through-hole.

In another embodiment of the inventive method of fabricating a tool, said stabilizing means comprises heat release tape, and said method further comprises removing said heat release tape after said second surface etching. In another embodiment of the inventive method of fabricating a tool, said method further comprising applying an identification indicia pattern into said tool for automated tracking and inventory, wherein said indica is selected from the group consisting of an identification code, a serial number, a bar code, and combinations thereof.

In another embodiment of the inventive method of fabricating a tool, said etching is Deep Reactive Ion Etching. A method of fabricating a single silicon crystal tool, said method further comprising plating a layer of plating material onto one of said first or said second surfaces. A method of fabricating a single silicon crystal tool, said method further comprising etching substantially all of said base material from said tool after plating said layer of plating material onto said base material.

The invention also provides a method for making a metal micro-structure comprising: providing a semiconductor substrate having first and second opposed surfaces; depositing a first layer of material onto said first substrate surface, said material having affinity for said substrate and for said metal; depositing a first patterned photoresist material onto said first layer, said patterned photoresist layer covering at least one area of said first layer and leaving at least one different area of said first layer uncovered; depositing a metallic layer onto said first layer not covered by said photoresist; and removing said first photoresist material.

In another embodiment of said method for making a metal micro-structure, the method further comprising: depositing a second patterned photoresist material onto said second substrate surface, said patterned photoresist layer covering at least one area of said second substrate surface and leaving at least one different area of said second substrate surface uncovered; and etching at least a portion of said substrate not covered by said photoresist. In yet another embodiment of the method for making a metal micro-structure, said etching completely removes said substrate, so that said structure is substantially an all metal structure. In another embodiment of the inventive method, said metal is selected from the group consisting of gold, nickel, copper, permalloy, an combinations thereof. In still another embodiment of the inventive method, said substrate is selected from the group consisting of silicon, silicon nitride, silicon dioxide, glass, germanium, gallium arsenide, aluminum, stainless steel, titanium, glass, and combinations thereof.

In still another embodiment of the inventive method, said substrate comprises a semiconductor material; and said first layer is selected from the group consisting of a plating base material and an oxide of said semiconductor material. In another embodiment, said semiconductor material comprises silicon and said first layer comprises silicon dioxide.

An another alternative embodiment of the inventive method for forming a structure having a plurality of metal layers on a substrate, said comprises: providing a substrate having first and second surfaces; depositing a first plating base of a first metal on said first substrate surface; depositing a first patterned photoresist layer to a height h1 on said plating base and a second patterned photoresist layer on said second substrate surface; plating a first layer of a second metal on said first plating base where said first plating base is not covered by said first photoresist; depositing a second plating base of a third metal on said first metal layer and on said first patterned photoresist layer; depositing a third patterned photoresist layer to a height h2 on said second plating base; plating a second layer of a third metal on said second plating base where said second plating base is not covered by said third photoresist; etching said substrate where said substrate is exposed by said second patterned photoresist; and stripping said photoresist and plating base metal from said structure. In one embodiment of this alternative embodiment, said substrate is selected from the group consisting of silicon, allium arsenide, germanium, glass, and combinations thereof.

The invention also includes an article or manufacture made according to any of the afore described embodiments of the inventive method.

Those workers in the art will appreciate that although certain structures and methods have been described relative to assembly of flying magneto-optical heads for rotating information storage media, that the neither the inventive structure nor inventive method are limited to this application. For example, micro-machined structures having the small feature size and precision will find widespread applicability for optical telecommunications modules, electro-magnetic actuators, electrical relays, raster scan display systems, inertial navigation sensors, atomic force microscope probes, and spectrometers, among other applications. Furthermore, although one inventive method has been described as an example of how such micro-machined components may be made, the invention is not limited to micro-machined structures made only according to the inventive method.

All publications, patents, and patent applications mentioned in this specification are herein incorporated by reference to the same extent as if each individual publication or patent application was specifically and individually indicated to be incorporated by reference.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A micro-miniature tool for manipulating a first miniature article relative to a second miniature article, said tool comprising:

a manipulator portion for interacting with said first article to be manipulated;

an elongate handle portion integrally formed with and extending from said manipulator portion and adapted to be held by an external positioning means;

said tool adapted for accessing and interacting with said first article to be manipulated in a confined space proximate said second article;

said tool including a base material; and said manipulator portion adapted to interact with a physical feature of said first article having a size dimension less than 500 microns.

2. A tool as in claim 1, wherein said base material comprises a single piece of substantially mono-crystalline material.

3. A tool as in claim 1, wherein said single piece of substantially mono-crystalline material is selected from the group consisting of silicon (Si), gallium arsenide (GaAs), germanium, doped germanium, doped silicon, and doped gallium arsenide.

4. A tool as in claim 2, wherein said tool is formed from a thin wafer of said crystalline material, and said manipulator portion is adapted to interact with a physical feature of said first article having a size dimension in the range between substantially 5 micron and substantially 200 micron.

5. A tool as in claim 1, further comprising a neck portion interposed between said manipulator portion and said elongate handle portion, said neck portion having a smaller cross-section than either said manipulator portion or said handle portion and integrally formed with each.

6. A tool as in claim 5, wherein said neck portion further comprises a break initiation site for concentrating stress in a local area in said neck portion when a force is applied to said elongate handle.

7. A tool as in claim 6, wherein said neck has a substantially rectangular cross section with at least two generally opposed sides, and including substantially opposed crack initiation sites in the form of notches on said at least two opposed sides of said neck to concentrate stress when said breaking force is applied to the side of said handle.

8. A tool as in claim 6, wherein said handle being separable from said manipulator portion when said manipulator portion is maintained in a substantially fixed position by an external holding force upon the application of a small breaking force applied to said handle to separate said manipulator portion from said handle portion within said neck portion.

9. A break-away holder for holding an optical element during assembly in an optical assembly comprising:

a mounting block for attaching an optical element;

a breakable neck;

a handle connected to said mounting block through said breakable neck adapted for positioning said optical element in said optical assembly by manipulation of said handle by an externally applied force;

said handle being separable from said mounting block after said mounting block is attached to said assembly upon the application of a small breaking force applied to said handle to break said neck.

10. A break-away holder as in claim 9, wherein said breaking force is greater than forces generally encountered during in-use handling of said holder, including being greater than forces experienced during positional manipulation of said optical element in said optical assembly; and said breaking force is smaller than forces that would disturb the alignment of said optical element or of other elements within said optical assembly.

11. A break-away holder as in claim 9, wherein said breakable tool is fabricated from a single crystal silicon material and the neck is constructed such that the neck breaks when the neck approaches 1% local strain.

12. A tool as in claim 1, wherein said tool is adapted for removal from said first article and from said region proximate said second article after manipulation of said first article without substantial alteration of said tool, and said removable tool comprising an optical alignment target for aligning an optical beam within a narrow channel.

13. A tool as in claim 12, wherein said alignment target comprises target portion for interacting with said optical beam, and a handle portion attached to said target portion and extending away from said target portion to permit insertion of and positional manipulation of said target portion.

14. A tool as in claim 13, wherein said target portion includes a target selected from the set of targets consisting of an aperture, a cross-hair, an optical stop, a holder for attaching another optical element, and combinations thereof.

15. A tool as in claim 1, wherein said tool is a fiber optical holder for holding a polarization maintaining optical fibre, said forked shaped portion of said tool for holding said fiber being connected to said handle by a break-away neck, said tool being rotatable with said fiber attached to a desired polarization orientation relative to a reference orientation, said holder being adapted for permanent mounting in said desired orientation, said tool having a breakable portion which after intentional breaking provides an alignment key used for coupling the oriented fiber to other optical elements, said broken neck portion further providing an indicator of polarization alignment.

16. A method of fabricating a single silicon crystal tool by comprising:

providing a substantially planar silicon wafer polished on each of two opposed surfaces;

applying a patterned photo resist material to each of said opposed surfaces so as to define and expose the regions to be etched and the regions to be protected on each said surface;

etching a first surface to a desired first etched depth;

attaching said etched first surface to stabilizing means;

etching a second surface to a desired second etched depth;

said first and second surface etching producing at least one feature selected from the group consisting of a wafer surface recesses, a plates, and a wafer through-hole.

17. A method as in claim 16, wherein said stabilizing means comprises heat release tape, and said method further comprises removing said heat release tape after said second surface etching.

18. A method as in claim 16, further comprising applying an identification indicia pattern into said tool for automated tracking and inventory, wherein said indica is selected from the group consisting of an identification code, a serial number, a bar code, and combinations thereof.

19. A holder as in claim 9, further including mating spring-clips and notches for connecting multiple holders together to form a three-dimensional structure.

20. A tool as in claim 1, further comprising a layer of metal plated on a portion of said base material.

21. A tool as in claim 2, wherein said single piece of substantially mono-crystalline material comprises silicon.

22. A tool as in claim 2, wherein said tool is formed from a thin wafer of said crystalline material.

23. A tool as in claim 22, wherein said tool is formed from said wafer by etching said tool from at least one side of said wafer.

24. A tool as in claim 23, wherein said etching is by deep reactive ion etching.

25. A tool as in claim 22, wherein said tool is formed from said wafer by wire electrical discharge machining.

26. A tool as in claim 22, wherein said tool is formed from a silicon wafer having a thickness less than about 400 microns.

27. A tool as in claim 22, wherein a plurality of said tools are formed simultaneously by deep reactive ion etching of a photo resist patterned single crystal silicon wafer, and said manipulator portion is adapted to interact with a physical feature of said first article having a size dimension in the range between substantially 5 micron and substantially 200 micron.

28. A tool as in claim 1, wherein said tool is adapted for removal from said first article and from said region proximate said second article after manipulation of said first article without substantial alteration of said tool.

29. A tool as in claim 28, wherein said tool comprises an optical alignment target.

30. A tool as in claim 28, wherein said tool comprises an optical fiber holder.

31. A break-away holder as in claim 9, wherein said breakable neck including a crack initiation site of a surface of said neck to concentrate stress when said breaking force is applied to said handle.

32. A break-away holder as in claim 9, wherein said breakable neck has a substantially rectangular cross section with at least two opposed sides, and including substantially opposed crack initiation sites in the form of notches on said at least two opposed sides of said neck to concentrate stress when said breaking force is applied to the side of said handle.

33. A break-away holder as in claim 9, wherein said neck breaks under a local strain of between about 1% and about 5% local strain.

34. A break-away holder as in claim 9, wherein said neck breaks under a local strain of between about 0.5 percent (0.5%) and about two percent (2%) local strain.

35. A break-away holder as in claim 9, wherein said neck breaks under a local strain of approximately 1 percent (1%) local strain.

36. A break-away holder as in claim 9, wherein said breakable tool is fabricated from a single crystal of material which breaks when the local strain reaches a predetermined strain value within plus and minus about 40 percent.

37. A break-away holder as in claim 9, wherein said part is substantially 0.2 mm deep, said handle is substantially 1 mm×3 mm, and said neck is substantially 0.08 mm×0.20 mm and has 0.015 mm deep opposed concave v-shaped notches.

38. A break-away holder as in claim 9, wherein said mounting block is attached to said assembly by an adhesive, said handle portion being about 2.2 mm long, and when a force of substantially 5 mN (milli-Newtons) is applied to the end of said handle so as to flex said neck about said notches, a breakage force sufficient to break said neck at said notches is produced while generating only about 15 N/mm$^2$ of stress in an adhesive attaching said mounting block to said assembly.

39. A tool as in claim 1, wherein said removable tool comprises an optical fiber holder having a generally forked shape having two tangs separated by a notch for holding said optical fibre perpendicular to said wafer.

40. A tool as in claim 39, wherein said optical fibre holder providing means for holding said fiber close to an end tip of said fibre during attachment of said fiber end to an optical module using a curing adhesive.

41. A tool as in claim 28, wherein said tool comprising an optical fiber holder including a spring portion and a shelf portion, said fiber being held between said spring and shelf generally parallel to said wafer.

42. A tool as in claim 12, wherein said alignment target is adapted for aligning a collimated laser beam relative to a desired optical path.

43. A break-away holder as in claim 9, wherein said break-away holder mounting block portion is adapted to receive an element selected from the group consisting of a lens, a coil, a fiber holder, a mirror, a prism, a grating, a magnet, and a piezo-electric device.

44. A break-away holder as in claim 43, wherein said element is mounted to said mounting block by fastening means.

45. A break-away holder as in claim 44, wherein said fastening means including adhesive, mounting block integrated springs, press-fit, and combinations thereof.

46. A break-away holder as in claim 9, wherein said holder includes orientation identifying means which remains with said tool after separating said handle from said mounting block at said breakable neck.

47. A break-away holder as in claim 46, wherein said orientation identifying means comprises a mechanical key.

48. A break-away holder as in claim 47, wherein said mechanical key further provides means for coupling a second element to said optical module at an orientation defined by said mechanical key.

49. A break-away holder as in claim 9, wherein said mounting blocks are severed from handles by separating multiple tabs with a cutting device, said provision of multiple tabs providing greater support for said mounting block as compared to a single tab or breakable neck section, and allowing multiple sections of the holder to be separated individually.

50. A break-away holder as in claim 9, wherein said optical tool includes an optical aperture directly fabricated into the silicon tool for use in an optical path.

51. A holder as in claim 9, further comprising capillary glue channels disposed on at least one surface to be attached to an external part, said capillary glue channels assisting in the distribution of small amounts of glue applied to ends of said capillary glue channels.

52. A holder as in claim 9, further including holes and pegs perpendicular to the plane of the wafer for connecting multiple holders together and for providing precise alignment said holder and said component to said assembly.

53. A tool as in claim 20, wherein said metal plating substantially covers at least one planar surface of said tool.

54. A tool as in claim 20, wherein said material comprises a material selected from the group consisting of: stainless steel, aluminum, silicon, glass, or titanium.

55. A tool as in claim 20, wherein said metal plating comprises a plating material selected from the group consisting of: copper, permalloy, gold, and combinations thereof.

56. A tool as in claim 55, wherein said base material is selected from the group consisting of: silicon nitride, silicon dioxide, glass, germanium, gallium arsenide, aluminum, and combinations thereof.

57. A method as in claim 16, wherein said etching is Deep Reactive Ion Etching.

58. A method as in claim 16, further comprising: plating a layer of plating material onto one of said first or said second surfaces.

59. A method as in claim 58, further comprising etching substantially all of said base material from said tool after plating said layer of plating material onto said base material.

60. A manufacture made according to the method in claim 16.

61. A method for making a metal micro-structure comprising:
providing a semiconductor substrate having first and second opposed surfaces;
depositing a first layer of material onto said first substrate surface, said material having affinity for said substrate and for said metal;
depositing a first patterned photo resist material onto said first layer, said patterned photo resist layer covering at least one area of said first layer and leaving at least one different area of said first layer uncovered;
depositing a metallic layer onto said first layer not covered by said photo resist;
removing said first photo resist material.

62. A method for making a metal micro-structure as in claim 61, further comprising:
depositing a second patterned photo resist material onto said second substrate surface, said patterned photo resist layer covering at least one area of said second substrate surface and leaving at least one different area of said second substrate surface uncovered; and
etching at least a portion of said substrate not covered by said photo resist.

63. A method for making a metal micro-structure as in claim 62, wherein:
said etching completely removes said substrate; and
whereby said structure is substantially an all metal structure.

64. A method for making a metal micro-structure as in claim 62, wherein:
said metal is selected from the group consisting of gold, nickel, copper, permalloy, an combinations thereof.

65. A method for making a metal micro-structure as in claim 62, wherein:
said substrate is selected from the group consisting of silicon, silicon nitride, silicon dioxide, glass, germanium, gallium arsenide, aluminum, stainless steel, titanium, glass, and combinations thereof.

66. A method for making a metal micro-structure as in claim 61, wherein:
said substrate is a semiconductor material; and
said first layer is selected from the group consisting of a plating base material and an oxide of said semiconductor material.

67. A method for making a metal micro-structure as in claim 65, wherein said semiconductor material is silicon and said first layer comprises silicon dioxide.

68. A method for forming a structure having a plurality of metal layers on a substrate, said method comprising:
providing a substrate having first and second surfaces;
depositing a first plating base of a first metal on said first substrate surface;
depositing a first patterned photo resist layer to a height h1 on said plating base and a second patterned photo resist layer on said second substrate surface;

plating a first layer of a second metal on said first plating base where said first plating base is not covered by said first photo resist;

depositing a second plating base of a third metal on said first metal layer and on said first patterned photo resist layer;

depositing a third patterned photo resist layer to a height h2 on said second plating base;

plating a second layer of a third metal on said second plating base where said second plating base is not covered by said third photo resist;

etching said substrate where said substrate is exposed by said second patterned photo resist; and stripping said photo resist and plating base metal from said structure.

69. The method in claim 68 wherein said substrate is selected from the group consisting of silicon, allium arsenide, germanium, glass, and combinations thereof.

70. A tool as in claim 22, wherein said tool is formed from electrical wire discharge of a thin metal sheet.

* * * * *